(12) United States Patent
El-Sankary et al.

(10) Patent No.: US 7,187,310 B2
(45) Date of Patent: Mar. 6, 2007

(54) CIRCUIT CALIBRATION USING VOLTAGE INJECTION

(76) Inventors: Kamal El-Sankary, 3719 rue du Frere-Andre, Apt. #36, Montréal, QC (CA) H3V 1B2; Mohamad Sawan, 597 Bord de l'Eau, Laval, QC (CA) H7X 1T9

( * ) Notice: Subject to any disclaimer, the term of this patent is extended or adjusted under 35 U.S.C. 154(b) by 0 days.

(21) Appl. No.: 11/071,885

(22) Filed: Mar. 4, 2005

(65) Prior Publication Data
US 2006/0227025 A1   Oct. 12, 2006

(51) Int. Cl.
*H03M 1/10* (2006.01)
(52) U.S. Cl. ............ 341/120; 341/118; 341/155
(58) Field of Classification Search .......... 341/118, 341/120, 155, 161, 162
See application file for complete search history.

(56) References Cited

U.S. PATENT DOCUMENTS

| | | | |
|---|---|---|---|
| 5,771,012 A * | 6/1998 | Shu et al. ............ 341/118 |
| 6,137,431 A | 10/2000 | Lee et al. | |
| 6,184,809 B1 | 2/2001 | Yu | |
| 6,211,805 B1 | 4/2001 | Yu | |
| 6,369,744 B1 | 4/2002 | Chuang | |
| 6,384,757 B1 | 5/2002 | Kosonen | |
| 6,441,769 B1 | 8/2002 | Nagaraj | |
| 6,456,223 B1 | 9/2002 | Yu et al. | |
| 6,466,153 B1 | 10/2002 | Yu | |
| 6,515,611 B1 | 2/2003 | Fetterman et al. | |
| 6,563,445 B1 | 5/2003 | Sabouri | |
| 6,606,042 B2 * | 8/2003 | Sonkusale et al. ........ 341/120 |
| 6,617,992 B2 | 9/2003 | Sakurai | |
| 6,621,431 B2 * | 9/2003 | Engl et al. ............ 341/120 |
| 6,734,818 B2 | 5/2004 | Galton | |
| 6,750,799 B1 | 6/2004 | Opris | |
| 6,778,110 B2 * | 8/2004 | Jansson ............ 341/120 |
| 6,784,815 B2 | 8/2004 | Jonsson | |
| 6,822,601 B1 * | 11/2004 | Liu et al. ............ 341/161 |
| 2001/0026233 A1 * | 10/2001 | Hellberg et al. ......... 341/120 |
| 2005/0057379 A1 * | 3/2005 | Jansson ............ 341/120 |
| 2006/0031037 A1 | 2/2006 | Maloberti et al. | |

OTHER PUBLICATIONS

Yuh-Min Lin, IEEE Journal of Solid-State Circuits, vol. 26, No. 4, Apr. 1991.
David W. Cline, IEEE Journal of Solid-State Circuits, vol. 31, No. 3, Mar. 1996.
Andrew N. Karanicolas, IEEE Journal of Solid-State Circuits, vol. 28, No. 12, Dec. 1993.
Seung-Hoon Lee et al., IEEE Journal of Solid-State Circuits, vol. 27, No. 13, Dec. 1992.

(Continued)

*Primary Examiner*—Linh Nguyen
(74) *Attorney, Agent, or Firm*—Bereskin & Parr

(57) ABSTRACT

Efficient calibration of circuits is performed using injection imprecise voltage by using different voltages in a subtractive manner to be able to calibrate with respect to a voltage that is out of a desirable measurable range using measuring circuitry. Efficient background calibration of circuits is also achieved by providing an equivalent circuit element to circuit elements receiving an injected calibration signal, and switching circuit elements. Such imprecise voltages can be determined through such calibration, and then used to calibrate a second circuit generating the imprecise voltages.

36 Claims, 14 Drawing Sheets

OTHER PUBLICATIONS

Lauri Sumanen et al., A Digital Self-Calibration Method for Pipeline A/D Converters, Helsinki University of Technology, Electronic Circuit Design Laboratory, IEEE 2002, no month.

Ian Galton, IEEE Transactions on Circuits and Systems-II: Analog and Digital Signal Processing, vol. 47, No. 3, Mar. 2000.

Tzi-Hsiung Shu, IEEE Journal of Solid-State Circuits, vol. 30, No. 4, Apr. 1995.

Jipeng Li, IEEE Transactions on Circuits and Systems-II: Analog and Digital Signal Processing, vol. 50, No. 9, Sep. 2003.

Boris Murmann, IEEE Journal of Solid-State Circuits, vol. 38, No. 12, Dec. 2003.

Jipeng Li et al., High-Speed Pipelined A/D Converter Using Time-Shifted COS Technique Department of Electrical and Computer Engineering, IEEE 2002, no month.

Ahmed M. et al., IEEE Transactions on Circuits and Systems-II: Analog and Digital Signal Processing, vol. 50, No. 8, Sep. 2003.

K. El-Sankary et al., A New Digital Background Calibration Technique for Pipelined ADC, Polystim Neurotechnology Laboratory, ECOLE Polytechnique de Montreal, Department of Electrical Engineering, IEEE 2004, no month.*

Bang-Sup Song et al., IEEE Journal of Solid-State Circuits, vol. 23, No. 6, Dec. 1988.*

Yun Chiu et al., ISSCC 2004/Session 25/High-Resolution NYQUIST ADCs/25.4, 2004 IEEE International Solid-State Circuits Conference, no month.*

Paul C. Yu et al., IEEE Journal of Solid-State Circuits, vol. 31, No. 12, Dec. 1996.*

Kamal El-Sankary et al., IEEE Transactions on Circuits and Systems-II: Express Briefs, IEEE 2004, no month.*

Jun Ming et al., IEEE Journal of Solid State Circuits, vol. 36, No. 10, Oct. 2001.*

Un-Ku Moon et al., IEEE Transactions on Circuits and Systems-II: Analog and Digital Signal Processing, vol. 44, No. 2, Feb. 1997.*

Sung-Ung Kwak et al., IEEE Journal of Solid-State Circuits, vol. 32, No. 12, Dec. 1997.*

Paul C. Yu et al., ISSCC 2001/Session 8/NYQUIST ADCs/8.6, 2001 IEEE International Solid-State Circuits Conference, no month.*

K. Nair et al., ISSCC 2004/Session 25/High-Resolution NYQUIST ADCs/25.3, 2004 IEEE International Solid-State Circuits Conference, no month.*

E. Siragusa et al., ISSCC 2004/Session 25/High-Resolution NYQUIST ADCs/25.1, 2004 IEEE International Solid-State Circuits Conference, no month.*

Cormac S. G. Conroy et al., IEEE Journal of Solid-State Circuits, vol. 28, No. 4, Apr. 1993.*

Kamal El-Sankary et al., New Sampling Method to Improve the SFDR of Wide Bandwidth ADC Dedicated to Next Generation Wireless Transceiver, Polystim Neurotechnology Laboratory, Department of Electrical Engineering, ECOLE Polytechnique De Montreal, Oct. 2003.*

Naoki Kurosawa et al., IEEE Transactions on Circuits and Systems-II: Fundamental Theory and Applications, vol. 48, No. 3, Mar. 2001.*

Shafiq M. Jamal et al., IEEE Journal of Solid-State Circuits, vol. 37, No. 12, Dec. 2002.*

* cited by examiner

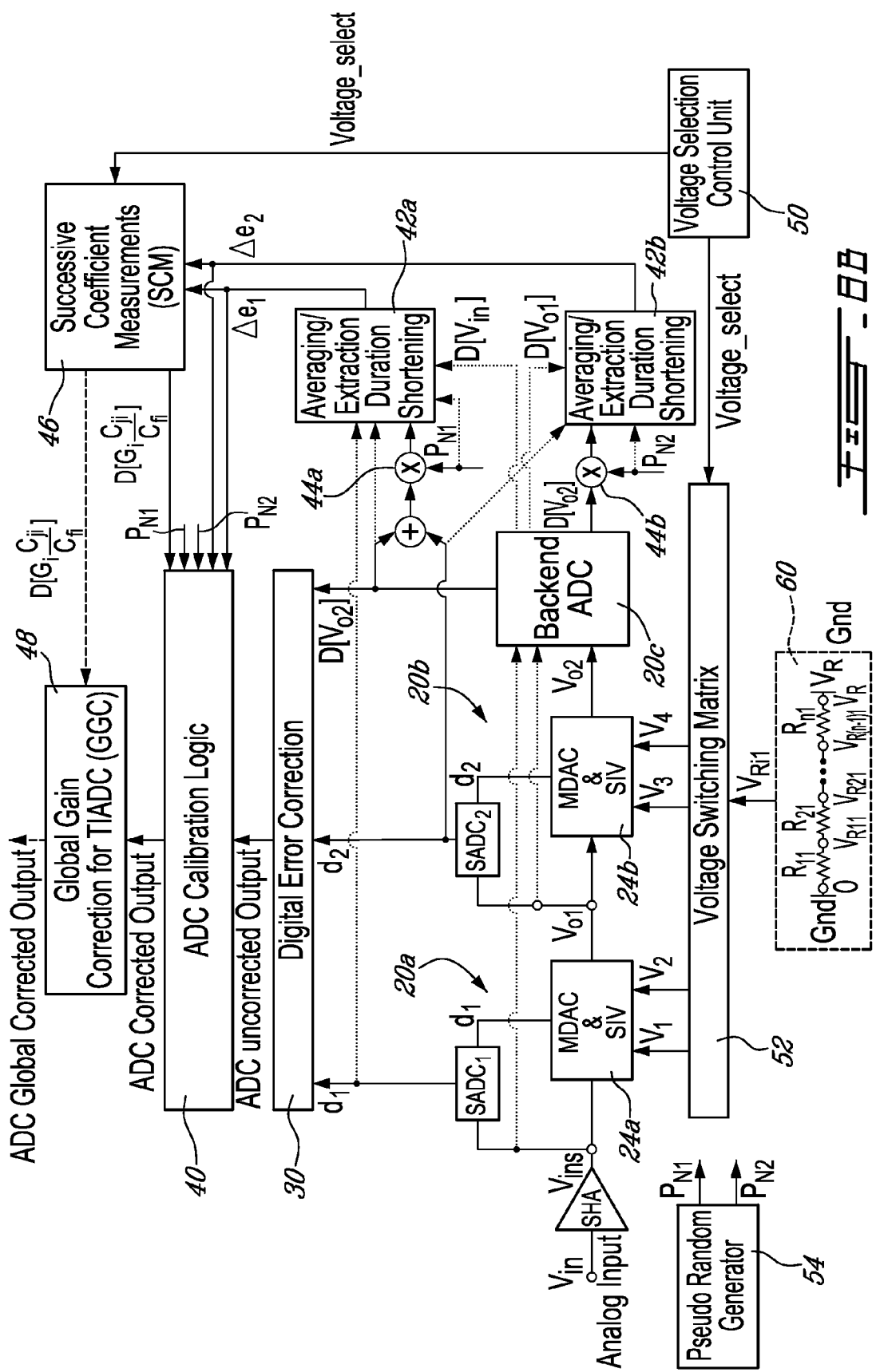

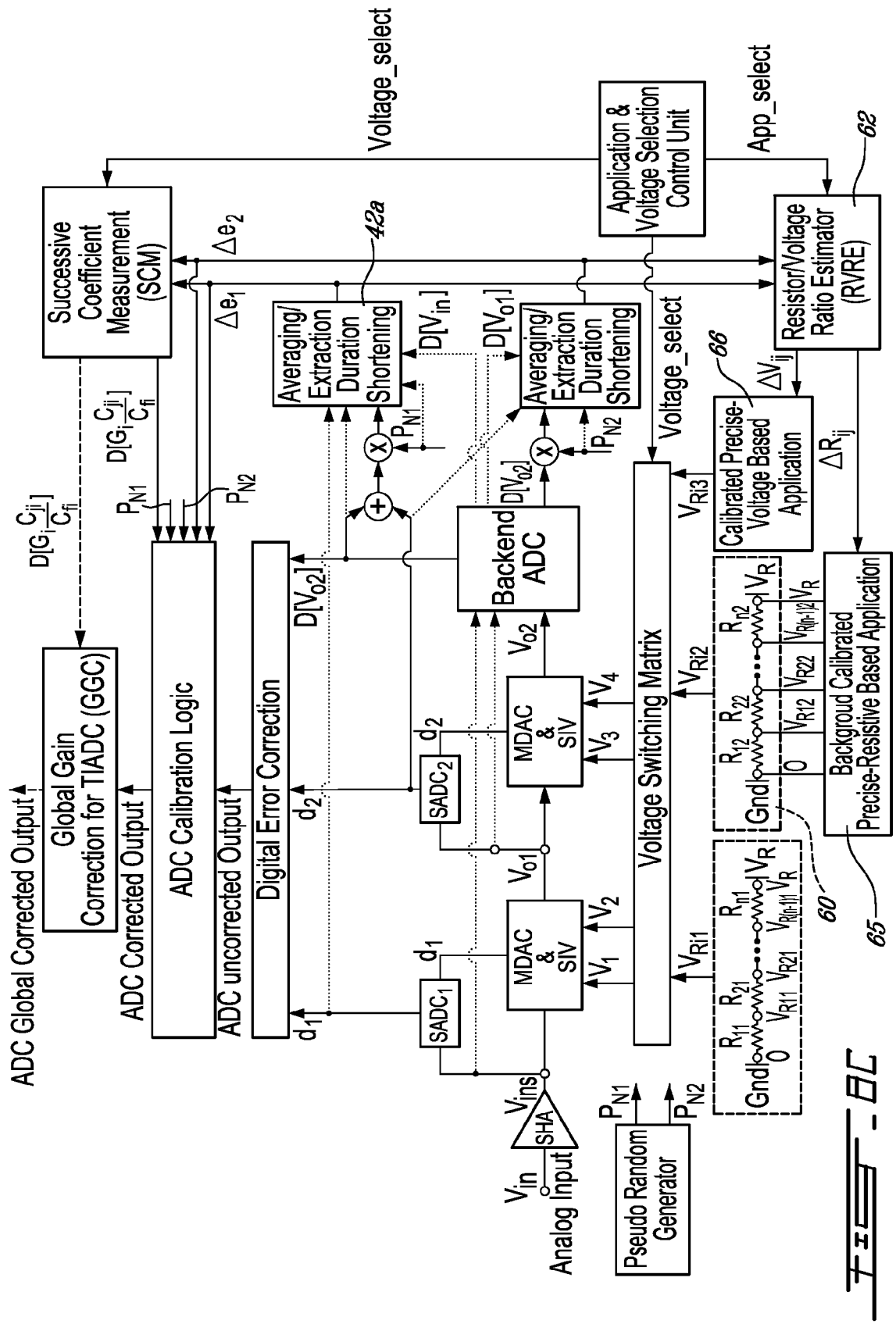

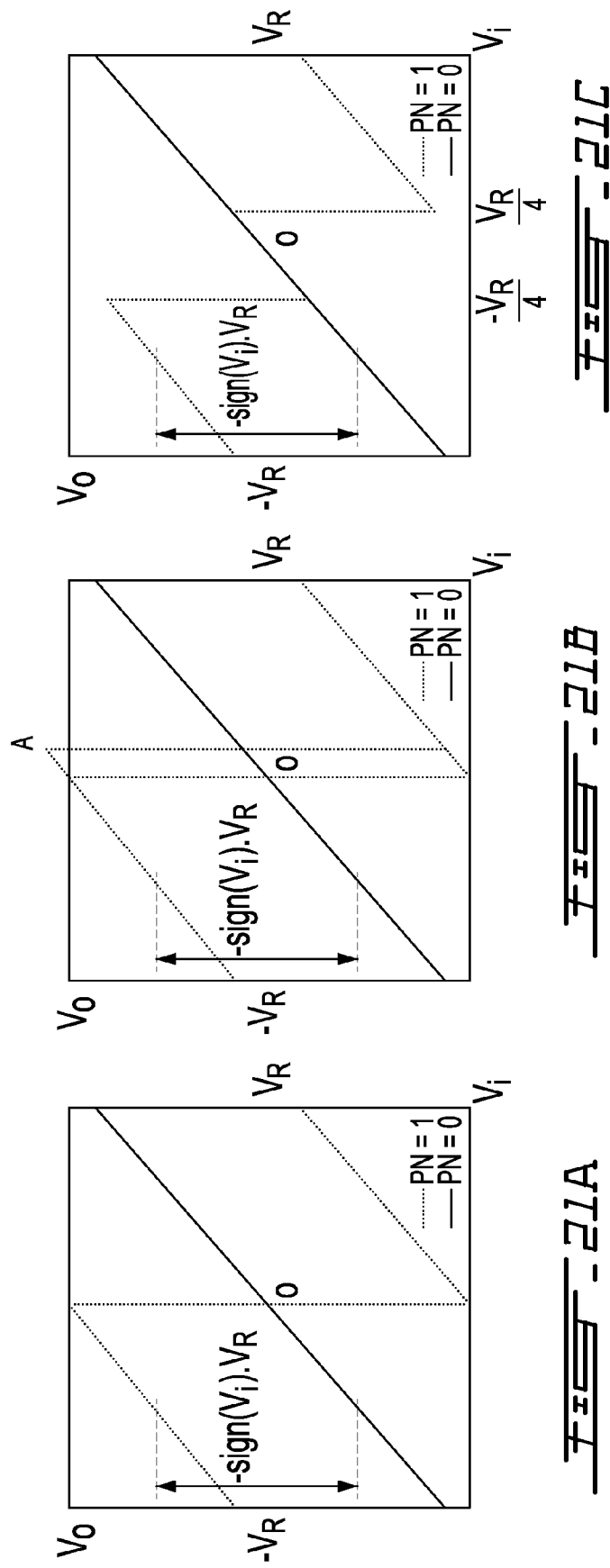

CIRCUIT CALIBRATION USING VOLTAGE INJECTION

FIELD OF THE INVENTION

The present invention relates to calibration of circuits, such as analog-to-digital converters and precision resistor based circuits.

BACKGROUND OF THE INVENTION

In precision circuits where the values of resistors, capacitors, transistors, and other components whose values in actual circuit implementations may be different from design specifications, either statically or transiently due to environmental conditions such as temperature, calibration of such values is of paramount importance. When a component value is calibrated and an error is detected, a physical component value can be changed or "trimmed" accordingly to compensate for an error, or the circuit components can be left alone and the error corrected or compensated for either by built-in compensation circuitry or computation logic or by external compensation. In cases of unacceptable errors or a lack of suitable compensation mechanism, the circuit may need to be discarded.

Calibration may be performed in a variety of ways. Two general types can be defined: background calibration; and foreground calibration. In foreground calibration, operation of the circuit is stopped while calibration is carried out, while in background calibration, circuit operation continues while calibration is carried out. Foreground calibration has the inherent advantage that test signals can be injected into the circuit without concern for the normal operation, and the desired values to be calibrated can be measured as a function of test signals. Measurement of the output values of the circuit as a whole or from selected circuit components or subcircuits is typically performed by additional testing logic, whether built-in or off-circuit. In the case of an ADC for example, a test analog signal can be swept though the dynamic range of the ADC, and the digital output response can be compared. Additionally or alternatively, key components can be fed specific test signals, and responses measured. Such test signals and response measurement are normally done by dedicated circuitry not involved in the normal operation of the circuit. In the case of calibrating a device, such as an analog-to-digital converter (ADC), there is significant advantage to being able to maintain precision of the device through background calibration without removing the device from normal continuous use. However, it is inherently more challenging to measure circuit values without disrupting normal operation by the use of known rest signals.

In some types of precision circuit devices, such as pipelined ADC's, the devices comprise interconnected stages, such as first stage precision circuitry whose output is measured by second stage precision circuitry. In the case of pipelined ADC's, the first stage converts one or more most-significant bits (MSB) of the analog signal, generates from those bits an analog signal to be subtracted from the input analog signal, and the difference is amplified and measured in the next stage. The next stage measures the next lesser significant bits, and the number of stages may be two, three or more. The last stage is often essentially a flash ADC. Flash ADC devices gain complexity and consume power almost geometrically for each additional bit of resolution added. Pipelined ADC's allow greater resolution without geometrically increasing complexity and power consumption, with the trade-off that each stage beyond the first introduces a sample delay in the output of the ADC.

SUMMARY OF THE INVENTION

It has been discovered that efficient calibration of circuits can be performed using imprecise voltages by using different voltages in a subtractive manner to be able to calibrate with respect to a voltage that is out of a desirable measurable range using measuring circuitry. The resulting calibration becomes independent of the exact value of the imprecise voltages. It has been further discovered that such imprecise voltages can be determined through such calibration, and then used to calibrate a second circuit generating the imprecise voltages.

It has been discovered that efficient background calibration of circuits can be performed by providing an equivalent circuit element to circuit elements receiving a calibration signal, and switching circuit elements.

According to one aspect of the invention, a digital background calibration technique to compensate for the nonlinearity and gain error in the sub-digital-to-analog converter (SDAC), amplifier finite DC gain, and reference voltage inaccuracy in multi-bit/stage pipelined analog-to-digital converter (ADC) is provided. By injecting subtractive imprecise voltages (SIV) in a modified conventional multi-bit multiplying digital-to-analog converter (MDAC) and performing correlation based successive coefficient measurements (SCM), a background calibration is achieved. This calibration does not need accurate calibration voltages or increasing the SDAC resolution.

Further, a global gain correction (GGC) for time-interleaved ADCs is provided. Techniques to shorten the calibration duration are further provided. Simulation results demonstrate that in the presence of realistic capacitor and resistance mismatch and finite op-amp gain, these techniques improve the linearity by several bits in single and multi-channel pipelined ADC.

According to one aspect of the invention, there is provided a method of background calibrating a circuit to be calibrated having a plurality of circuit elements and providing an output residue. The method comprises switching one of the circuit elements to be substituted by an equivalent circuit element within the circuit, and injecting at least one calibration signal into at least one of the circuit elements, wherein the calibration signal causes a measurable change in the output residue. The measurable change is measured and a calibration parameter for the circuit is calculated based on the change, and a calibration correction to an output of the circuit is performed using the parameter. Optionally, the calibration correction comprises correcting for the measurable change.

In the case that the output residue is essentially an AC signal, the change may be measured by obtaining an average of the output residue with the calibration signal injected and an average of the output residue without the calibration signal injected, the change being a difference between the averages. In this case, the injecting may comprise alternating between no injecting and injecting of the calibration signal from measurement to measurement. So that the averages may be free of aliasing, the injecting may alternate in a random or pseudorandom manner.

In some embodiments, the circuit is a pipelined ADC comprising a plurality of stages, the measuring being performed using the stages downstream of one of the stages whose circuit elements are being calibrated, the magnitude of the measurable change being small enough such that the output residue is within a dynamic range of the downstream stages.

According to another aspect of the invention, there is provided a method of calibrating a voltage reference. The method comprises providing a first circuit having a plurality of calibrated circuit elements and generating an output residue having a dynamic range for measurement, the calibrated circuit elements having a known value. At least two calibration signals are provided to operate in the first circuit in a subtractive manner so that the output residue remains within the dynamic range. This involves providing a group of different imprecise voltages for the calibration signals having at least one value that used alone would cause the residue to lie outside the dynamic range and at least one value that used alone would cause the residue to lie within the dynamic range, selecting a series of different combinations of ones of the group of imprecise voltages for injection in the subtractive manner, the series of combinations including one of the imprecise voltages to be isolated once, a remainder of the imprecise voltages each used in two of the different combinations, with one of the different combinations comprising a zero voltage and one of the imprecise voltages having a value that used alone would cause the residue to lie within the dynamic range, and injecting in the first circuit each of the different combinations of the imprecise voltages as the calibration signals. The measurable change for each of the different combinations is measured, and from a sum of the change measured for each of the different combinations, a value is calculated that is a function of the one of the imprecise voltages to be isolated independently of the remainder of the imprecise voltages. Preferably, the first circuit may comprise circuitry that outputs as the residue a difference between the calibration signals, the reference value being the value calculated that is equal to the one of the imprecise voltages to be isolated.

In a preferred embodiment, the group of imprecise voltages comprises a string resistance connected at one end to a reference voltage and to the zero voltage at another end. In this case, steps of the method can be repeated to identify a ratio of resistances in the string resistance.

According to another aspect of the invention, there is provided a multiplying-digital-to-analog (MDAC) circuit for use in a background calibrated pipelined analog-to-digital (ADC) circuit. The MDAC comprises a plurality, n, of inputs from a sub-digital-to-analog converter (SDAC), an amplifier, a feedback capacitor and switches for connecting the feedback capacitor in a first state between ground and a first modulated voltage, and in a second state between an input of the amplifier and an output of the amplifier, a switch matrix having a plurality, n+1, of outputs for controllably directing, in response to a control signal, the inputs from the SDAC and a second modulated voltage, and a plurality, n+1, of summing capacitors connected on one side to the input of the amplifier and connected on another side, in the first state, via switches to a stage input voltage and, in the second state, via switches to an output of a corresponding one of the switch matrix outputs. Preferably, the switch matrix comprises a plurality, n+1, of multiplexers, wherein n of the multiplexers have one input connected to a corresponding one of the inputs from the SDAC, and an (n+1)th one of the multiplexers has an input from each of the inputs from the SDAC, the multiplexers each having an input from the second modulated voltage, and providing a corresponding one of the switch matrix outputs.

According to a further aspect of the invention, there is provided a method of background calibrating a pipelined ADC circuit to be calibrated having a plurality of circuit elements and providing an output residue. The method comprises injecting at least one calibration signal into at least one of the circuit elements of a stage of the ADC under calibration, wherein the calibration signal causes a measurable change in the output residue of the stage, predicting a value of the output residue of the stage without the injecting, using a backend ADC of the pipelined ADC to measure an output residue of a stage upstream of the stage under calibration, and predicting a value of a sub-DAC output of the stage under calibration, measuring the change using the output residue of the stage under calibration using the backend ADC, the predicted value of the output residue of the stage without the injecting, and the predicted value of the sub-DAC output of the stage under calibration, calculating a calibration parameter for the circuit based on the change, and performing a calibration correction to an output of the circuit using the parameter. Preferably, the measuring of the change may comprise obtaining an average of the comparison of the output residue with the predicted value.

According to a further aspect of the invention, there is provided a method of background calibrating a circuit to be calibrated having a plurality of circuit elements and providing an output residue in which the residue occupying an identified frequency range during normal operation. The method comprises injecting at least one calibration signal into at least one of the circuit elements of the circuit, wherein the calibration signal causes a measurable change in the output residue of the stage, and alternating between no injecting and injecting of the calibration signal from measurement to measurement at an injection frequency resulting in the measurable change having a frequency outside of the frequency range. The method then comprises detecting the identified frequency range, and setting the injection frequency such that the measurable change has a frequency outside the identified frequency range, filtering the residue to detect the change at the frequency outside of the frequency range, calculating a calibration parameter for the circuit based on the change, and performing a calibration correction to an output of the circuit using the parameter. In some embodiments, when there is no suitable injection frequency resulting in the measurable change having a frequency outside of the frequency range, then the change may be measured by obtaining an average of the output residue with the calibration signal injected and an average of the output residue without the calibration signal injected, the change being a difference between the averages, the injecting alternating in a random or pseudorandom manner, whereby the averages are free of aliasing. In the case that the circuit is a pipelined ADC circuit, the step of filtering may comprise using a backend ADC of the pipelined ADC to measure the filtered residue.

BRIEF DESCRIPTION OF THE DRAWINGS

The invention will be better understood by way of the following detailed description of a preferred embodiment with reference to the appended drawings, in which:

FIG. 8B is a block diagram of a multi-bit/stage pipelined ADC including background calibration according to the preferred embodiment;

FIG. 8C is a block diagram identical to FIG. 8B with the addition that the imprecise voltage source being shared with a precise-resistive based application circuit;

FIGS. 21a, 21b and 21c illustrate the transfer function of the sample-and-hold circuit according to the embodiment of FIG. 20.

DETAILED DESCRIPTION OF THE PREFERRED EMBODIMENT

According to the preferred embodiment, a novel digital background calibration technique that corrects for the non-linearity and gain error in the sub-DAC (SDAC), amplifier finite DC gain and reference voltage inaccuracy in a multi-bit/stage pipelined ADC is provided. This background cali-bration technique does not rely on accurate injected calibration voltages that are difficult to be obtained on chip or that would increase the SDAC or SADC precision or even split up the capacitor sizes that limit the maximal achievable speed. Also a global gain correction (GCC) useful for time-interleaved ADC (TIADC) and techniques to shorten the calibration duration are provided.

Multibit/stage Pipelined ADC Digital Calibration

Figure 1:
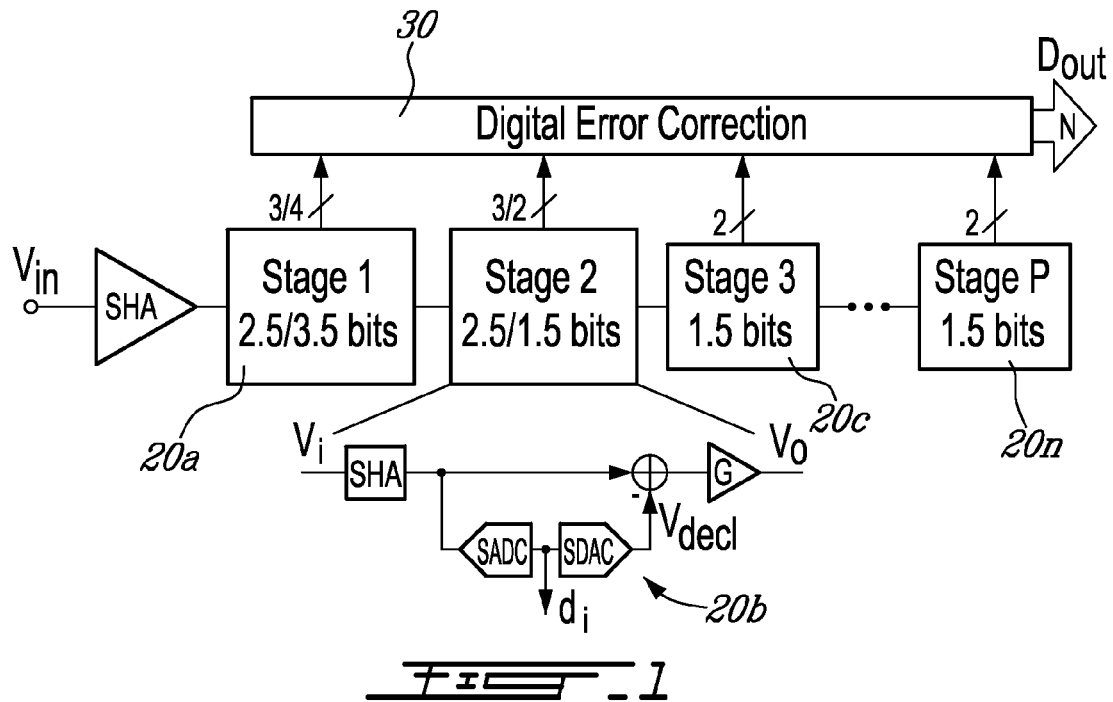
FIG. 1 is a block diagram of a multi-bit/stage pipelined ADC according to the prior art.

The general block diagram of a pipelined ADC where front-end stages resolve several bits (e.g 2.3 or 3.5) is shown in FIG. 1. The output residue $V_n$ of stage i is expressed as:

$$V_o = G_i \cdot (V_i - V_{daci}) \tag{1}$$

Where $V_{in}$ and $G_i$ are the SDAC analog output and the interstage gain respectively.

The input of the entire pipelined ADC can be obtained by:

$$V_{in} = V_{dac1} + \frac{V_{dac2}}{G_1} + \frac{V_{dac3}}{G_1 G_2} + \ldots + \frac{V_{dacp}}{G_1 G_2 \ldots G_{p-1}} + \Delta \tag{2}$$

where $\Delta$ stands for the quantization error of the entire ADC.

According to Eq. (2) the input signal can be accurately generated when the effective values of $V_{daci}$ and $G_i$ are used. Capacitor mismatch creates non-linearity in the SDAC that limits the precision of $V_{daci}$. Also the capacitor mismatch and the finite opamp gain deviate $G_i$ from its ideal value.

Figure 2:
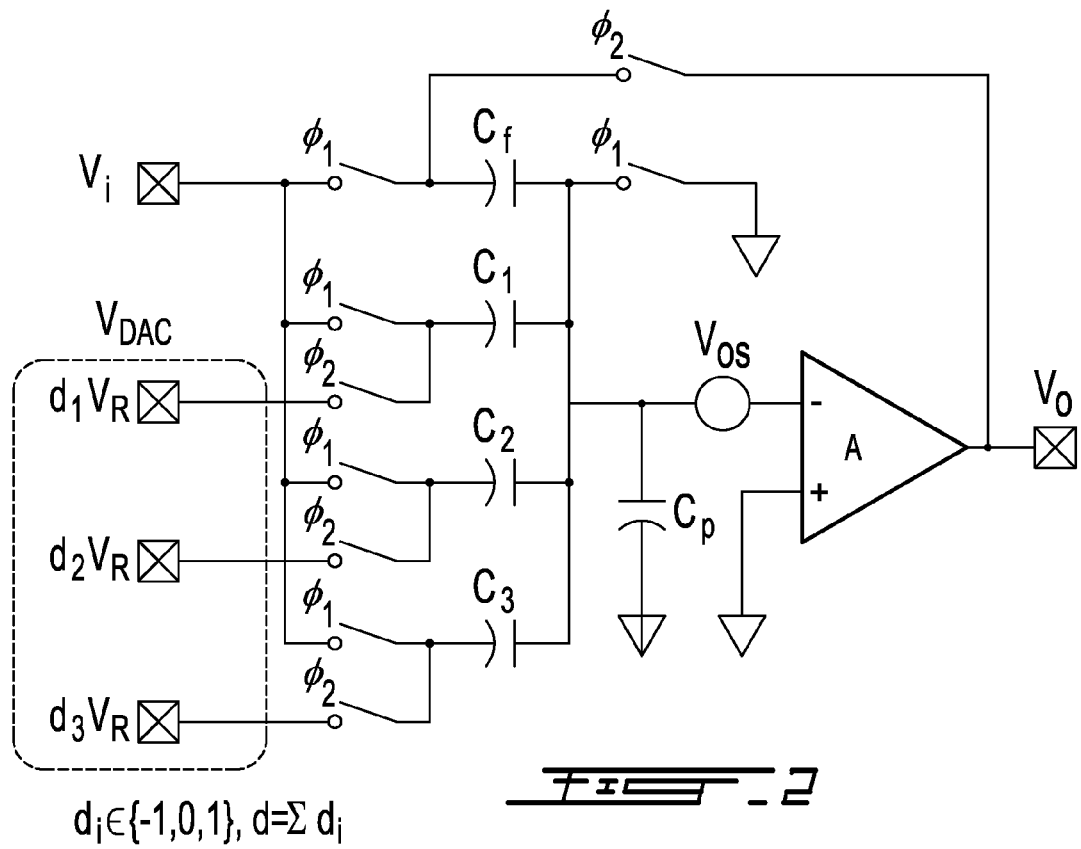
FIG. 2 is a circuit diagram of a 2.5 bit per stage multiplying digital-to-analog converter (MDAC) according to the prior art.

The MDAC circuit of FIG. 2 includes the SDAC, the adder and the amplifier illustrated in the schematic expansion of the Stage 2 block of FIG. 1. On $\phi_1$, the analog voltage from the sample and hold circuit, SHA, is loaded onto the capacitors, while on $\phi_2$, the amplifier feedback through $C_1$—is connected, and the digital values from the sub-ADC (SDAC) are loaded on the capacitors to measure the difference between $V_i$ and $V_{DAC}$. For a 2.5 bit/stage multiplying digital-to-analog converter (MDAC), as shown in FIG. 2, the residue voltage can be derived as:

$$V_p = G_A \cdot G_p \cdot (V_1 - V_{dac1} + \frac{C_T + C_p}{C_t} \cdot V_{as}) \tag{3}$$

where $$C_T = C_f + C_1 + C_2 + C_3 \tag{4}$$

$$G_A = 1/(1 + 1/Af) \tag{5}$$

and $G_A$ is the interstage gain due to the finite opamp gain A that is ideally equal 1.

The feedback factor f is equal:

$$f = C_f/(C_T + C_P) \tag{6}$$

$C_P$ is the virtual ground parasitic capacitance.

$$G_C = (C_1 + C_2 + C_3 + C_i)/C_f \tag{7}$$

$G_C$ is the interstage gain due to SDAC ideally equal $2^2$.

$$G_1 = G_A \cdot G_C \tag{8}$$

$$V_{daci} = (d_1 \cdot C_1 + d_2 \cdot C_2 + d_3 \cdot C_3) \cdot V_R/C_T \tag{9}$$

$G_1$ is the interstage gain and $V_{daci}$ is the SDAC output.

$V_R$ is the reference voltage and $d_1$ are the digital output code of the SADC where $d_i \in \{=1,0,1\}$ and $d=\Sigma_{i=1}^{3} d_i$.

Figure 3A:
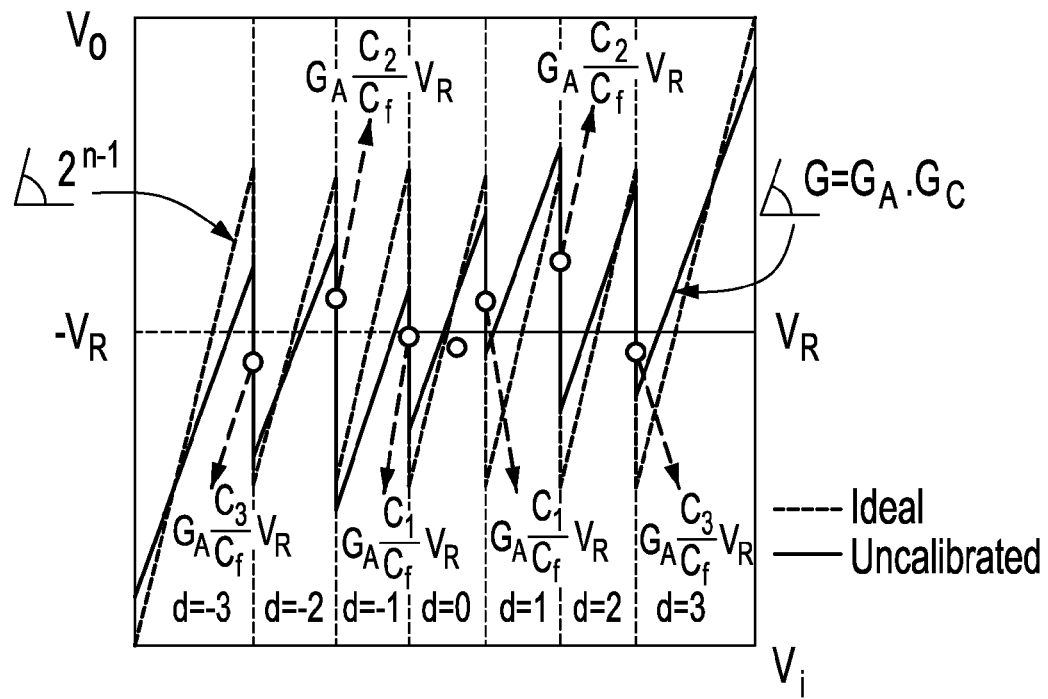
FIG. 3A is a plot of the residue of a realistic 2.5 bit per stage MDAC compared to an ideal one.

FIG. 3A depicts the residue plot of a realistic 2.5 bit/stage given by Eq. (3) compared with an ideal one. Nonlinearity of the SDAC and the inter-stage gain error, due to the deviation of $G_1$ from $2^2$, introduce mismatch in the residue jumps in the different boundaries of the digital code d. FIG. 3A shows the effect of this error on the input-output relationship of the overall pipelined ADC when the stage i is considered as the first stage and the remaining stages were ideal. The discontinuities, generally referred to as major-carry jumps in the uncalibrated ADC curve shown in FIG. 3A, cause deleterious missing codes and harmonic distortion that degrade considerably the ADC performance.

By measuring exactly the value of the jumps $G_A \cdot (C_i/C_f) \cdot V_R$ in the residue and by using the following equation, the residue output becomes linear when it is referred to the input of the stage i despite the gain errors of the SDAC and the opamp, and the reference voltage inaccuracy.

$$V_o - \sum_{i=1}^{3} d_i \cdot G_A \cdot \frac{C_i}{C_f} \cdot V_R = G_A \cdot G_C \cdot V_i \quad (10)$$

Ideally the gain is equal to $2^{n-1}$ for n-bit SADC in the stage i. After the correction using Eq. (10) the backend, constituted now from the stage i and the following stage, is linear with a global gain $G_i = G_A \cdot G_C$.

Figure 4:
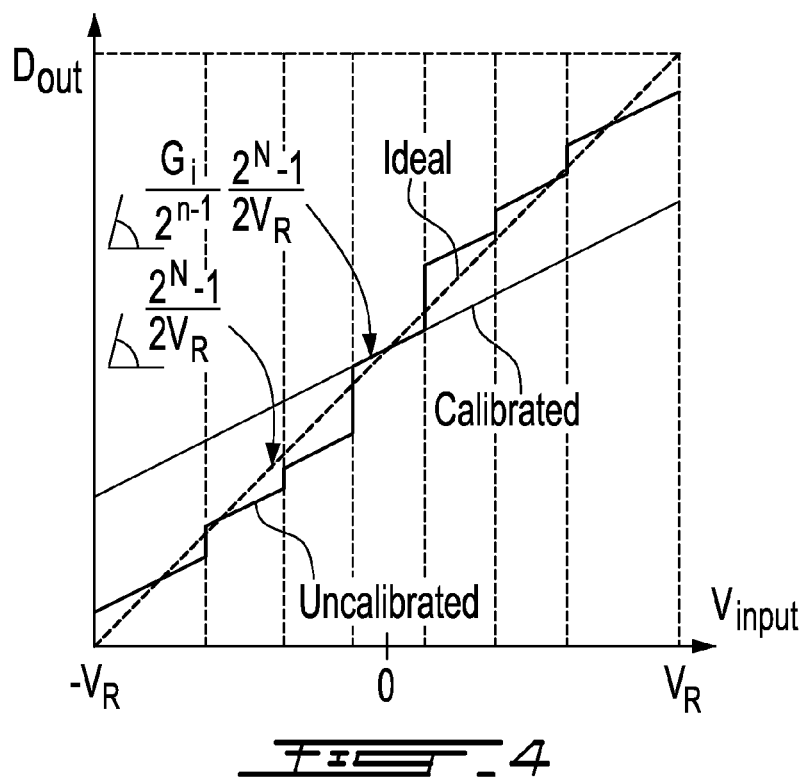
FIG. 4 is a plot of the input-output relationship of the overall pipelined ADC comparing ideal, uncalibrated and calibrated responses.

When the stage i is the first stage and after calibrating the ADC the calibrated transfer curve is shown in FIG. 4, where the input-output relationship is linearized and the global gain is equal to the ideal gain multiplied by $G_1/2^{n-1}$. After measuring the errors associated with stage i, stage i−1 can be calibrated using the linearized backend formed from stage i and its following stages.

Figure 5:
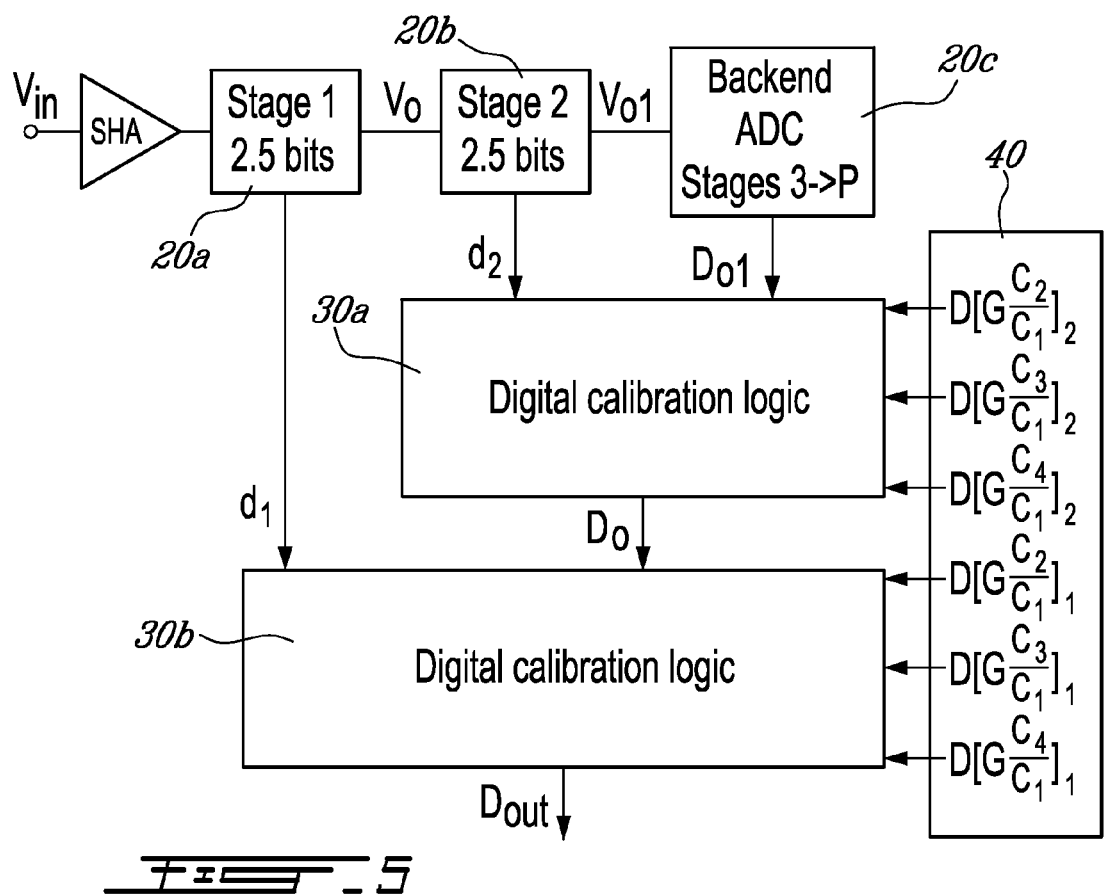
FIG. 5 is a block diagram showing digital calibration logic used in the final digital output construction in a pipelined multi-bit per stage ADC.

The final digital output $D_{out}$ is constructed, as shown in FIG. 5, by starting the correction from the least significant stages to the most significant ones.

Global Gain Correction

Figure 6:
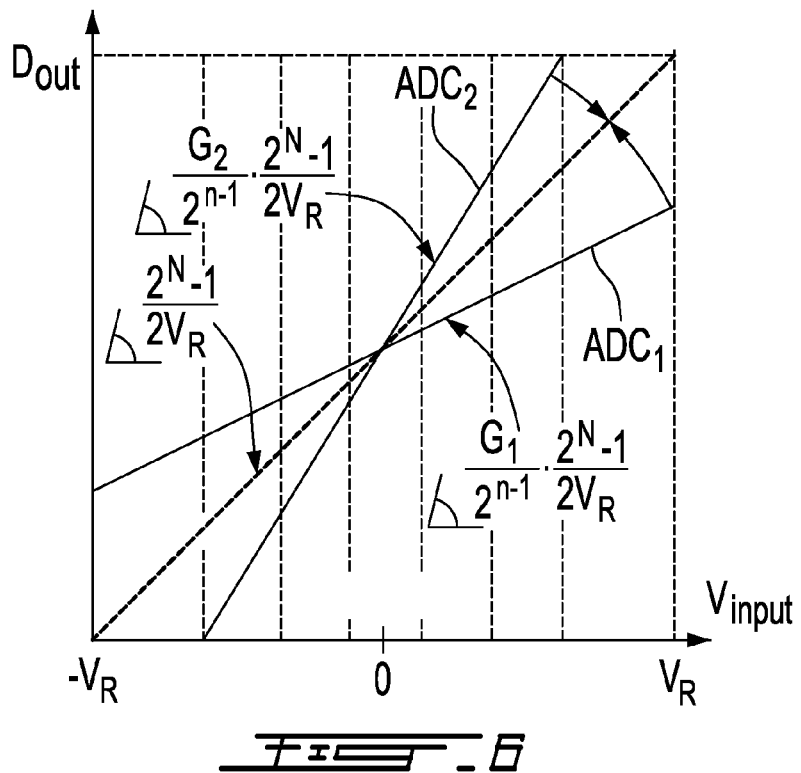
FIG. 6 is a plot illustrating the transfer functional of 2 ADC's compared with an ideal one.

Several calibration methods cause the slope of the overall ADC transfer characteristic to depend on the actual residue gains and is therefore not well controlled. FIG. 4 shows that the final gain is multiplied by $G_1/2^{n-1}$ in the case of correction of the first stage. The global gain mismatch is harmful for some applications such as time interleaved ADC (TIADC) that are inevitable when increasing the speed is desired with high resolution ADCs to overcome the technology limits. With gain mismatch between the different channels, inband distortions are created and that degrades considerably performance of time-interleaved ADC systems, as for example is known from the article by N. Kurosawa, H. Kobayashi, K. Maruyama, H. Sugawara and K. Kobayashi, titled "Explicit analysis of channel mismatch effects in time-interleaved ADC systems," and published in *IEEE Trans. Circuits Syst. I*, vol. 48, pp. 261–271, March 2001. In FIG. 6, the transfer functions of 2 ADCs are compared with an ideal one. By succeeding in measuring the global gain $G_1/2^{n-1}$ and $G_2/2^{n-1}$ for the channels $ADC_1$ and $ADC_2$, a global gain correction is possible by dividing the final digital output of each ADC by $2^{n-1}/G_1$ and $2^{n-1}/G_2$ respectively (FIG. 6).

In the case of calibrating the first stages in $ADC_1$ and $ADC_2$, the gain $G_1(i=1,2)$ can be computed using the following equation, $$G_1 = G_A \cdot G_C \quad (11)$$
$$= \left(\frac{C_f + C_1 + C_2 + C_3}{C_f}\right) \cdot G_A$$
$$= G_A + G_A \cdot \frac{C_1}{C_f} + G_A \cdot \frac{C_2}{C_f} + G_A \cdot \frac{C_3}{C_f}$$

This equation indicates that for a global gain correction (GGC), a separate measurement for the gain $G_A$ from the other products in Eq.(10) needs to be performed.

Digital Background Calibration

Figure 3B:
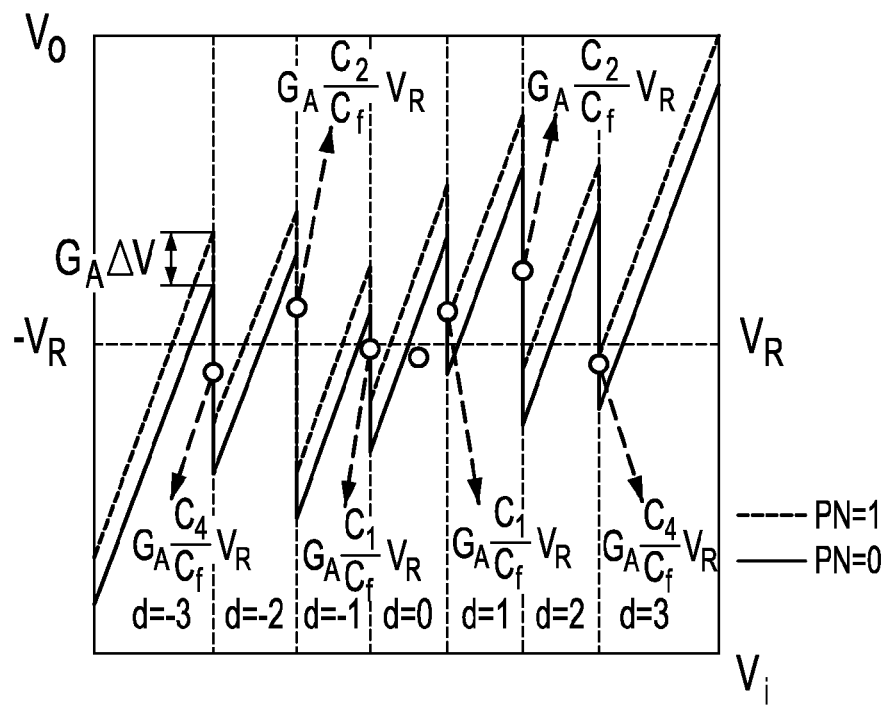
FIG. 3B is a similar plot of the residue of a realistic 2.5 bit per stage MDAC illustrating the change in the residue as a result of injecting a calibration signal.
Figure 7:
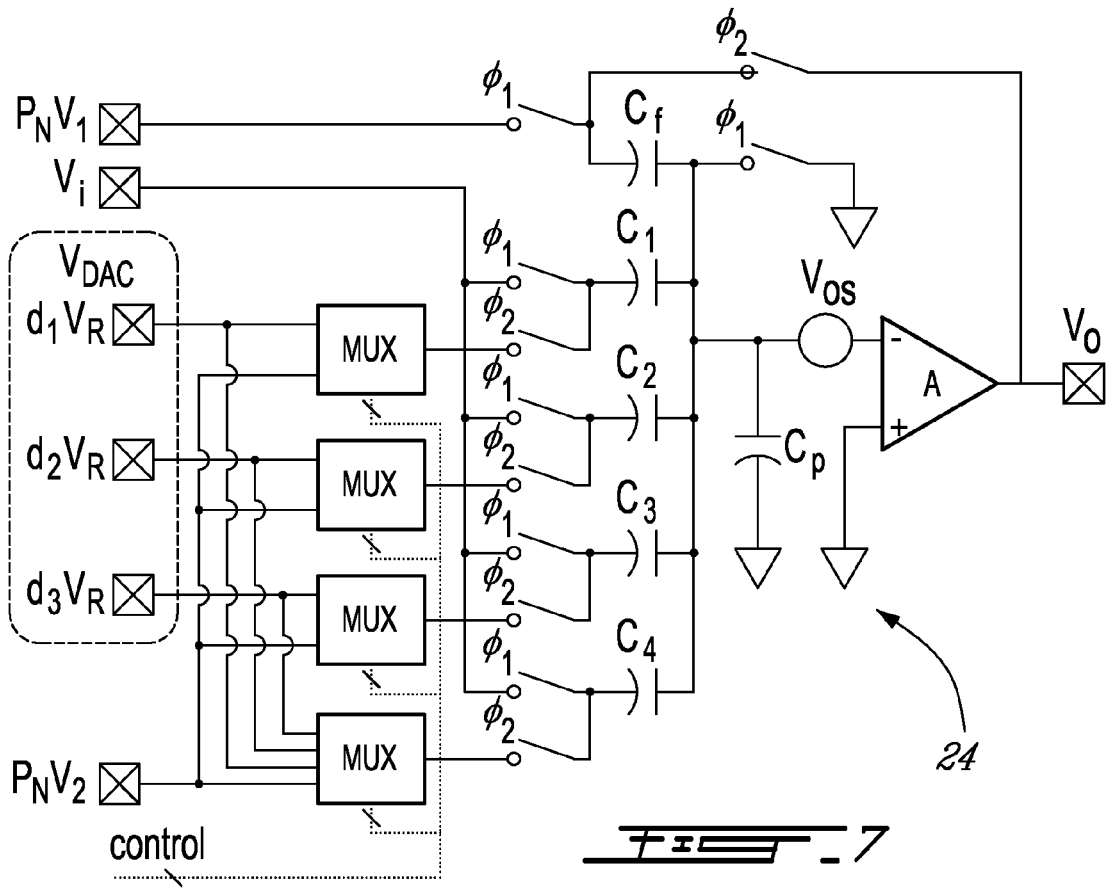
FIG. 7 is a block diagram of a modified 2.5 bit per stage multiplying digital-to-analog converter (MDAC) according to the preferred embodiment in which the modified MDAC is used for background calibration of a multibit per stage pipelined ADC digital calibration.

In the background calibration method of the preferred embodiment, the team $G_A(C_i/C_f)V_R$ is measured for the different values of $C_i$ to enable the usage of Eq. (10). A schematic of a modified 2.5-bit MDAC according to the preferred embodiment is shown in FIG. 7. The most significant modification of this MDAC from the conventional one is the addition of an extra capacitor $C_4$. Furthermore, voltage $V_1 \cdot P_N$ is sampled onto the feedback capacitor $C_f$ when $\phi_1$ is high, where $P_N$ is a pseudorandom signal alternating between 0 and 1. FIG. 3B illustrates the influence of $P_N$ on the MDAC response.

Capacitor $C_4$ is used instead of $C_f$ to sample the input voltage when $\phi_1$, is high. By doing so, a voltage equal $G_A \cdot V_1$ is injected in the residue output. In background calibration, $V_{in}$ is an unknown, and thus an average of the residue is calculated. With reference to the residue plot of FIG. 3, it will be appreciated that the residue average across all $d_i$ values has a "DC" mean value, the latter being increased when $P_N$ is 1 by $\Delta V = G_A \cdot (V_1 - (C_4/C_f)V_3)$ and then returning its normal value when $P_N$ is 0. When the averaging is complete for $C_4$, and $\Delta V$ is measured, the multiplexers in FIG. 7 are controlled to calibrate the next in the remainder of the capacitors.

Figure 8A:
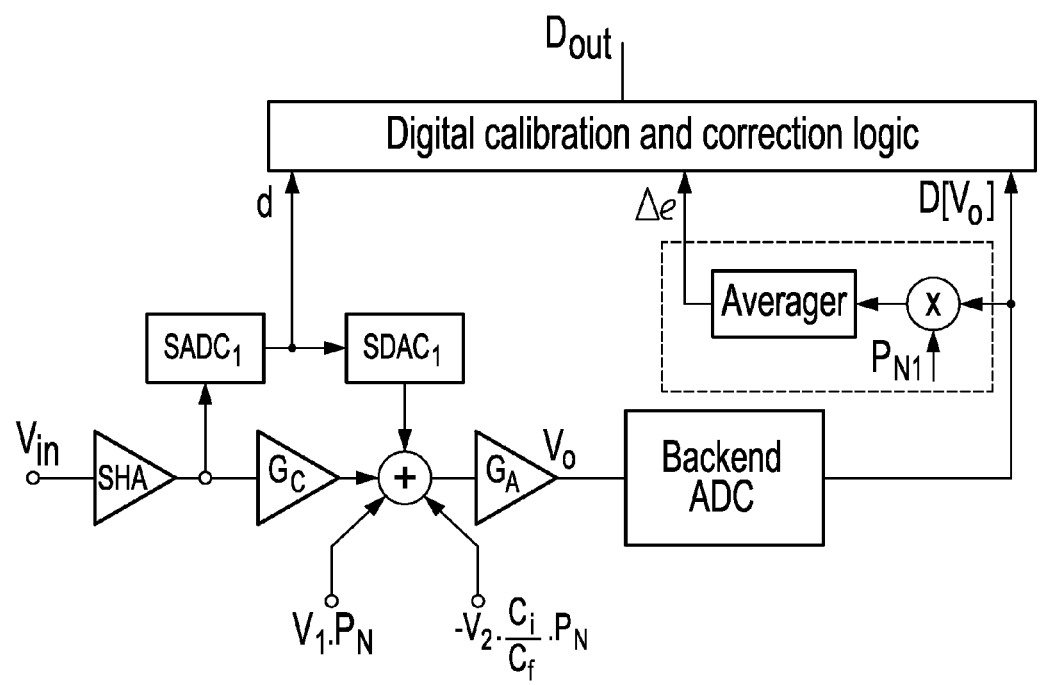
FIG. 8A is a block diagram of a simplified example wherein the subtractive imprecise voltage (SIV) background calibration technique is applied to the first stage of a pipelined ADC.

To not consume much from the offset correctable range of the SADC, $V_1$ should be a small and stable analog voltage. A voltage could be injected by splitting up the unit capacitor but the voltage $V_1$ cannot be made arbitrarily small. Also, splitting up the capacitors will limit the maximal achievable speed because, in this case, sampling capacitors bigger than the minimal possible size will be used. For this reason, a voltage $V_2 - P_N$ is sampled onto the capacitor $C_4$ in the next phase when $\phi_2$ is high. The voltage $V_1$ and $V_2$ do not need to be accurate (as explained below). By injecting these voltages, a subtractive imprecise voltage (SIV) is injected in output residue for the stage under calibration given by:

$$V_o = G_A \cdot \left(G_C \cdot V_1 - \frac{d_1 \cdot C_1 + d_2 \cdot C_2 + d_3 \cdot C_3}{C_f} \cdot V_R + \right. \quad (12)$$
$$\left. P_N \cdot V_1 - P_N \cdot \frac{C_2}{C_f} \cdot V_2 + \frac{\sum_{i=1}^{N} C_1 + C_f + C_P}{C_f} \cdot V_{o3}\right) =$$
$$G_A \cdot \left(V_1 - V_2 \cdot \frac{C_o}{C_f}\right) \cdot P_N + V_{o1}$$

where $G_C = (C_1+C_2+C_3+C_4)/C_f$ and $V_{o1}$ is the remaining term in $V_n$, A simplified example wherein the SIV technique is applied to the first stage is shown in FIG. 8A. By correlating the backend ADC digital output $D[V_n]$ with $P_N$ the term $\Delta V = G_A \cdot (V_1 - (C_4/C_f)V_2)$ is extracted. $P_{N1}$ is used for correlation instead of $P_N$, Where $P_{N1}$ alternates between −1 and +1 instead of 0 and 1 in $P_N$. That substitution averages out the mean of the remaining term $D[V_{n1}]$ since $P_{N1}$ has a mean value of 0.

The output of the averager $\Delta e$ is given by:

$$\Delta e = \frac{1}{N}\sum_{k=1}^{N}(D[V_o(k)] \cdot P_{N1}(k)) \quad (13)$$

$$= \frac{1}{N}\sum_{k=1}^{N}(D[\Delta V] \cdot P_N(k) \cdot P_{N1}(k)) +$$

$$\frac{1}{N}\sum_{k=1}^{N}(D[V_{o1}(k)] \cdot P_{N1}(k))$$

The expected value of $\Delta e$ is:

$$E[\Delta e] = \frac{D[\Delta V]}{N}\sum_{k=1}^{N}(E[P_N(k) \cdot P_{N1}(k)] \cdot) + \quad (14)$$

$$\frac{1}{N}\sum_{k=1}^{N}E[D[V_{o1}(k)] \cdot P_{N1}(k)]$$

$$= \frac{1}{2} \cdot D[\Delta V]$$

Since $D[V_{o1}]$ and $P_{N1}$ are uncorrelated and $E[P_N(k) \cdot P_{N1}(k)] = \frac{1}{2}$, the variance, $\sigma^2_{\Delta e}$, of $\Delta e$ is:

$$\sigma^2_{\Delta\sigma} = E[\Delta e^2] - E[\Delta e]^3 \quad (15)$$

$$= \frac{1}{N^2}\sum_{t=1}^{N}(E[D[V_{n1}(k)]^2] \cdot E[P^2_{N1}(k)])$$

$$= \frac{1}{N}\sigma^2_{D[V_{o1}]}$$

where $\sigma^2_{VN1} = E[P^2_{N1}(k)] = 1$.

The averager output is not constant in the steady state. Instead, it contains a random fluctuation caused by the term involving the variance of $D[V_{n1}]$. Because this term is accumulated, however, it can be made arbitrarily small by increasing the number of samples (N) at the input of the averager in FIG. 8A.

In the simplified example of FIG. 8A, only the first stage is calibrated. It will be appreciated that the modified MDAC of FIG. 7 is used to perform calibration for each term related to each capacitor in order to achieve full calibration. In the complete block diagram of FIG. 8B illustrating the preferred embodiment, two stages 20a and 20b are calibrated, and the calibration control system 50 is shown. The pseudorandom generator 54 provides two uncorrelated streams of binary signals, $P_{N1}$ and $P_{N2}$. As in FIG. 8A, the signals may be converted from a 0 and 1 state used in the FIG. 7 into a −1 and +1 state for use in correlation so that the mean correlation has a value of 0. The imprecise voltages $V_1$ and $V_2$ used in MDAC 24a and $V_3$ and $V_4$ used in MDAC 24b are provided by a voltage switching matrix 52. The control unit 50 outputs control signals for the switching matrix 52 and the muxes of the MDAC's 24 to select a capacitor to receive the imprecise voltage selected. The controls signals are also communicated to the successive coefficient measurement unit 46 that analyses the averaged errors $\Delta e_1$ and $\Delta e_2$ to determine the correction values associated with each capacitor in the MDAC's. The ADC calibration logic 40 uses the correction values from unit 46 along with the random values $P_{N1}$ and $P_{N2}$ to process each sample from the ADC uncorrected output from the digital error correction unit 30 to provide the desired corrected output samples. Global gain correction, that is particularly desirable in the context of a time-interleaved ADC, is schematically illustrated as being performed in unit 48 on the output of calibration logic 40. Of course, global gain correction can be performed within logic 40.

The voltages injected into MDAC 24b cause a measurable change in the residual $V_{o2}$ that is measured by the backend ADC 20c. The residue $V_{o1}$ is measured by the sub-ADC of stage 20b. Measurement of the measurable change caused by the subtractive injection is done using a correlator 44a,44b and averaging unit 42a,42b for the respective stages under calibration to provide the respective averaged errors $\Delta e_1$ and $\Delta e_2$.

Increasing the number of samples N to achieve calibration means increasing the required calibration time. In the following, two techniques to accelerate the convergence rate at a low overhead are described. In the preferred embodiment, the term $G_A(C_4/C_f)V_R$ is found by injecting subtractive imprecise voltages (SIV) and performing successive coefficient measurements (SCM) as explained below. In the first coefficient measurement, $V_1$ is set equal to $(K-1)V_R/K$ and $V_3$ equal to $V_k$ where K is an even number. In that case, a term $g_1$ is measured. In the second one $V_1$ is set to $(K-1)V_R/K$, $V_2$ equal to $(K-2)V_R/K$ and coefficient $g_1$ is obtained. At the K−1 measurement $V_1$ is set to $V_R/K$, $V_2$ to $2 \cdot V_n/K$, and it gives $g_{R-1}$. Finally $V_1$ is set to $V_R/K$ and $V_3$ to ground and $g_k$ is obtained.

Using the following equations:

$g_1 = G_A \cdot (((K-1) \cdot V_R/K) - (C_4/C_f) \cdot V_R/K)$ $g_2 = G_A \cdot (((K-1) \cdot V_R/K) - (C_4/C_f) \cdot ((K-2) \cdot V_R/K)))$ $g_3 = G_A \cdot ((K-3) \cdot (V_R/K) - (C_4/C_f) \cdot ((K-2) \cdot (V_R/K)))$ $g_4 = G_A \cdot ((K-3) \cdot (V_R/K) - (C_4/C_f) \cdot ((K-4) \cdot (V_R/K)))$ $g_{K-2} = G_A \cdot ((3 \cdot V_R/K) - (C_4/C_f) \cdot (2 \cdot V_R/K))$ $g_{K-1} = G_A \cdot ((V_R/K) - (C_4/C_f) \cdot (2 \cdot V_R/K))$ $g_K = G_A \cdot (V_R/K) \quad (16)$ the term $G_A(C_4/C_f)V_n$ is obtained by:

$G_A(C_4/C_f)V_r = -g_1 + g_2 - g_3 + g_4 - \ldots + g_{K-2} - g_{K-1} + g_K \quad (17)$ The same procedure is repeated for every capacitors where $C_4$ will replace the one used in the coefficient measurement procedure.

The reference voltages used in SGM do not need to be accurate because there are eliminated from Eq. (17) and a simple string resistance can be used to measure the gain term. The same string resistance used to generate the references of the SADC could be used.

If K is chosen to be equal 8, in every coefficient measurement a voltage around $V_R/8$ is injected in the second stage. Injecting such small voltage means that the non-overload range equal $V_R/2 - V_R/8$ is left for SADC correction. That non-overload range can correct SADC offset up to $=(3/4)V_R/8$ instead of $=V_R/8$ in 2.5 b/stage without this method. This will alleviate the comparator requirements compared to other calibration methods where a precise voltage of $V_R/4$ is injected leaving non-overload range of $V_R/4$ and offset correctable range of $\pm(1/2)V_R/8$ (see E. Siragusa and I. Galton, "A digitally enhanced 1.8V 15 b 50 MS/s CMOS pipelined ADC," *ISSCC Dig. Tech. Papers*, pp. 452–453, February 2004). Moreover the comparator offset correctable range can increase arbitrarily to approach $\pm V_R/8$ by using more reference voltages and by performing more SGM.

Setting K equal to 8 means 8 calibration cycles are needed to measure every coefficient $G_A(C_i/C_f)V_R$. The addition of the 8 coefficients means that the variance in eq. (15) is now 8 times higher. To obtain the same resolution for the gain as one coefficient measurement, the number of samples in every measurement needs to be 8·N instead of N. Knowing that we need 8 gain measurements so the total number of samples needed is 8·(8·N). To shorten the gain calibration to only one cycle of measurement (e.g. 8·N) the calibration voltages are applied in the following manner. In the first sample $V_1$ is set equal to $(K-1)V_R/K$ and $V_2$ equal to $V_N$ so the injected coefficient is equal to $g_1$. In the second sample, we set $V_2$ and $V_3$ to obtain $g_1$ and so on until injecting the voltage that gives the coefficients $g_8$. After $g_8$, the injected voltages are repeated to obtain $g_1$ again and so on. In this case the averager output is written as:

$$\Delta e = \frac{1}{N}\sum_{k=1}^{N}(D[V_o(k)] \cdot P_{N1}(k)) \quad (18)$$

$$= \frac{1}{N}\sum_{k=1}^{N}(D[g_1] \cdot P_{Ns1}(k) \cdot P_{N1}(k)) + \ldots +$$

$$\frac{1}{N}\sum_{k=1}^{N}(D[g_8] \cdot P_{Ns8}(k) \cdot P_{N1}(k)) +$$

$$\frac{1}{N}\sum_{k=1}^{N}(D[V_{o1}(k)] \cdot P_{N1}(k))$$

$$8 \cdot E[\Delta e] = \frac{1}{2} \cdot (D[g_1] \cdots + D[g_A]) + \quad (19)$$

$$\frac{1}{N}\sum_{k=1}^{N}E[D[V_{o1}(k)] \cdot P_{N1}(k)]$$

$$= \frac{1}{2} \cdot D[G_A(C_t/C_f)V_R]$$

where $E[P_{Nu}(k) \cdot P_{N1}(k)] = \frac{1}{16}$ and the variance of $\quad (20)$ $$\Delta e_1 = 8 \cdot \Delta e \text{ is: } \sigma^2_{\Delta e_1} =$$

$$\frac{8}{N^2}\sum_{t=1}^{N}(E[D[V_{o1}(k)]^2] \cdot$$

$$E[P^2_{N1}(k)])$$

$$= \frac{8}{N}\sigma^2_{D[V_{o1}]}$$

So to obtain the same resolution as the one coefficient (e.g. $g_1$) measurement N should be multiplied by $2^3$ and only one measurement is sufficient to determine $G_A(C_t/C_f)V_R$. It will be appreciated that the gain measurement does not need the injection of an accurate analog voltage or an increasing in the SDAC linearity or even splitting up the minimal size capacitor that limit the speed.

By using the capacitor $C_4$ instead of $C_f$ to sample the input voltage when $\phi_1$ is high in the modified MDAC, the interstage gain $G_A \cdot G_C$ is now constant despite periodically changing of the capacitor under measurement. Also this modification avoids the need to measure $G_A$ and $G_A(C_i/C_f)$ separately as indicated in eq. (11). In this embodiment, the term given in eq. (11) is constructed for the modified MDAC of FIG. 7 in the digital domain by summing the already measured terms $G_A(C_i/C_f)$ related to every capacitor:

$$D[G_1] = D[((C_1 + C_2 + C_3 + C_4)/C_f) \cdot G_A] \quad (21)$$

$$= D[G_A \cdot (C_1/C_f)] + D[G_A \cdot (C_2/C_f)] +$$

$$D[G_A \cdot (C_3/C_f)] + D[G_A \cdot (C_4/C_f)]$$

and then the corrected digital output of the ADC is divided by $G_1$. In the case of several stages to be corrected, $G_A$ given in eq. (21) will be measured directly multiplied by the new gain of the backend ADC ($G_{back}$) where $G_A = G_{back} \cdot (1/(1+1/Af))$. And then, $G_1$ is constructed by the same equation given in eq. (21).

Calibration Duration Shortening

Figure 10:
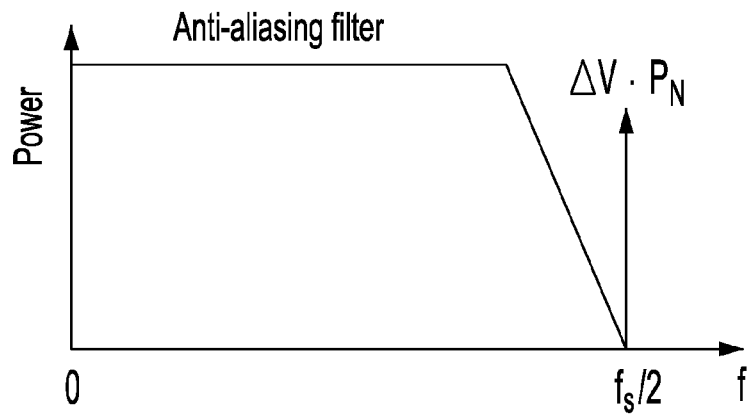
FIG. 10 illustrates a filter characteristic of a filter used to measure injected calibration signals in a residual output, the residual output having a maximum frequency during normal operation less than fs/2, and the injected signal being injected at a frequency of fs/2.

Two techniques that shorten the calibration duration are provided Eq. (15) indicates that the calibration cycles can be shortened by increasing N or by reducing the variance of D[Vol]. The first technique is applicable when an anti-aliasing filter precedes the ADC (e.g. the ADC is not used for under-sampling) and that only the first stage of the ADC needs to be calibrated. In this case, this filter could be made to provide a 0 power at the frequency $f_s/2$. In this case, $P_N$ could be alternate between +1 and 0 periodically to modulate the calibration term at $f_s/2$ as shown in FIG. 10. That will eliminate the interference between the calibration term and the full-scale spread input signal and that will reduce the number of samples needed.

It will be appreciated that The residue or residual voltage D[Vol] occupies an identified frequency range during normal operation. The injecting of the calibration signal involves alternating between no injecting and injecting of the calibration signal from measurement to measurement at a frequency resulting in the measurable change in D[Vol] having a frequency outside of the identified frequency range. The measuring of the change uses filtering of the residue D[Vol] to detect the change at the frequency outside of said frequency range. This gives the value of the change in D[Vol] without long averaging. Since the frequency range of the ADC input can occupy any or all of the range of the ADC, the frequency range can be detected during operation. It can then be determined whether there is a suitable frequency resulting in the measurable change having a frequency outside of the frequency range of D[Vol]. If there is such a suitable frequency then a filter is advantageously to obtain the measure of the change more quickly. If not, then the change is measured by obtaining an average of the output residue with the calibration signal injected and an average of the output residue without the calibration signal injected. The change is then a difference between the two averages, and the injecting is done in a random or pseudorandom manner, so that the averages are free of aliasing.

Figure 11:
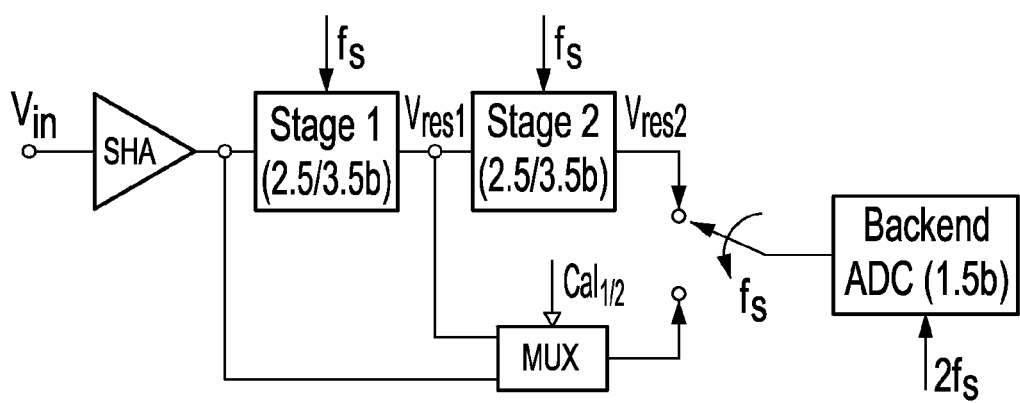
FIG. 11 is a block diagram of an embodiment of a background calibrated pipelined ADC in which the backend stage operates at double frequency to be able to measure the residual of two stages.

When the ADC has no empty spectrum to modulate the calibration signal on it, the input signal will be spread all over the bandwidth when multiplied by a pseudo-random $P_N$ sequence. Knowing that the input signal is preferred to be full-scale to maximize the dynamic range, the input variance can be decreased by subtracting Vol from eq. (15). To calibrate a multibit per stage pipelined ADC, the input to be subtracted is the input of the stage under calibration and not necessarily the input signal (except for the first stage). Usually a multibit per stage pipetined ADC has front-end stages resolving several bits (e.g 2.3 or 3.5) and a backend constituted from 1.5 b/stages as shown in FIG. 1. In this embodiment, the backend ADC and the SADC for the stages under calibration are used to predict the variance of Vol during the normal operation of the ADC. Knowing that the accuracy required from the backend ADC is relaxed and also knowing that the stages in the backend are configured as 1.5 b/stage, this backend can be run at double speed without the need for additional overhead (see FIG. 11).

When stage 2 is undergoing calibration in one cycle, the backend ADC is connected to the input of stage 2 (Cal=1) to estimate the input signal $V_{res1}$. In the next period, the backend ADC performs its normal operation for the whole ADC. $V_{res1}$ is sampled at $f_s$ while the backend is operating at $2 \cdot f_s$ that means that this voltage is constant during the 2 operations.

The value obtained by backend ADC during the normal operation of the ADC is:

$$V_{res2} = G_2 \cdot (V_{res1} - V_{DAC2}) + \Delta V \cdot PN \tag{22}$$

If we subtract from $V_{res2}$ the value estimated by the backend $\hat{V}_{res1}$ multiplied by $2^2$ instead of $G_2$ and by using the output of SADC to estimate the SDAC output ($\hat{V}_{DAC2}$) multiplied by $2^2$ Eq. (22) becomes:

$$V_{res2\_new} = (G_2 \cdot V_{res1} - 2^2 \cdot \hat{V}_{res1}) + \tag{23}$$
$$(G_2 \cdot V_{DAC2} - 2^2 \cdot \hat{V}_{DAC2}) + \Delta V \cdot PN$$

For capacitor mismatch of ±0.2% and opamp DC gain of 60 dB we find that:

$$G_2 2^2 \cdot (1 + \epsilon \cdot 2^{-7}) \tag{24}$$

Where $\epsilon$ is between −1 and +1.

The estimated value $\hat{V}$ is equal to $V - Q(V)$ where $Q(V)$ is the quantization error between the backend ADC and the ADC formed from stage 2 and the same backend or the error between the estimated output $\hat{V}_{dac2}$ of SDAC of stage 2 and $V_{DAC2}$. Also Var[Q(V)] Var[V]/$2^{2h}$ where the precision of the backend is 10-bit.

From eq. (23), the variance $\sigma^2_{66e}$ of the output of the averager $\Delta e$ can be estimated by:

$$\sigma^2_{\Delta e} = \frac{1}{2^{10}N} \sigma^2_{D[Vol]} \tag{25}$$

Thus the number of samples needed without this signal subtraction is divided by $2^{10}$. That means, for ADC with 14-bit resolution, instead of requiring a number of $2^{30}$ iterations now only $2^{20}$ iterations are sufficient. That shortens the calibration cycle by 1000.

After calibration of stage 2, stage 1 is calibrated using the same manner. The residue obtained from the stage 1 in the normal operation of the ADC is given by:

$$V_{res1} = G_1 \cdot (V_{in} - V_{DAC1}) + \Delta V \cdot PN \tag{26}$$

Again to reduce the variance of the $G_1 \cdot (V_{in} - V_{DAC1})$ the term V could be estimated using the already calibrated stage 2 and the following stages but that means that stage 2 need to run at double speed and that is not desirable. Instead the same backend used to predict $V_{res1}$ is now used to predict $V_{in}$ as shown in FIG. 7. The control signal (cal) switches the input of the backend to the input of the stage 1. The other term $V_{DAC1}$ is replaced by estimated value from SADC of stage 1 obtained during the normal operation.

Figure 12:
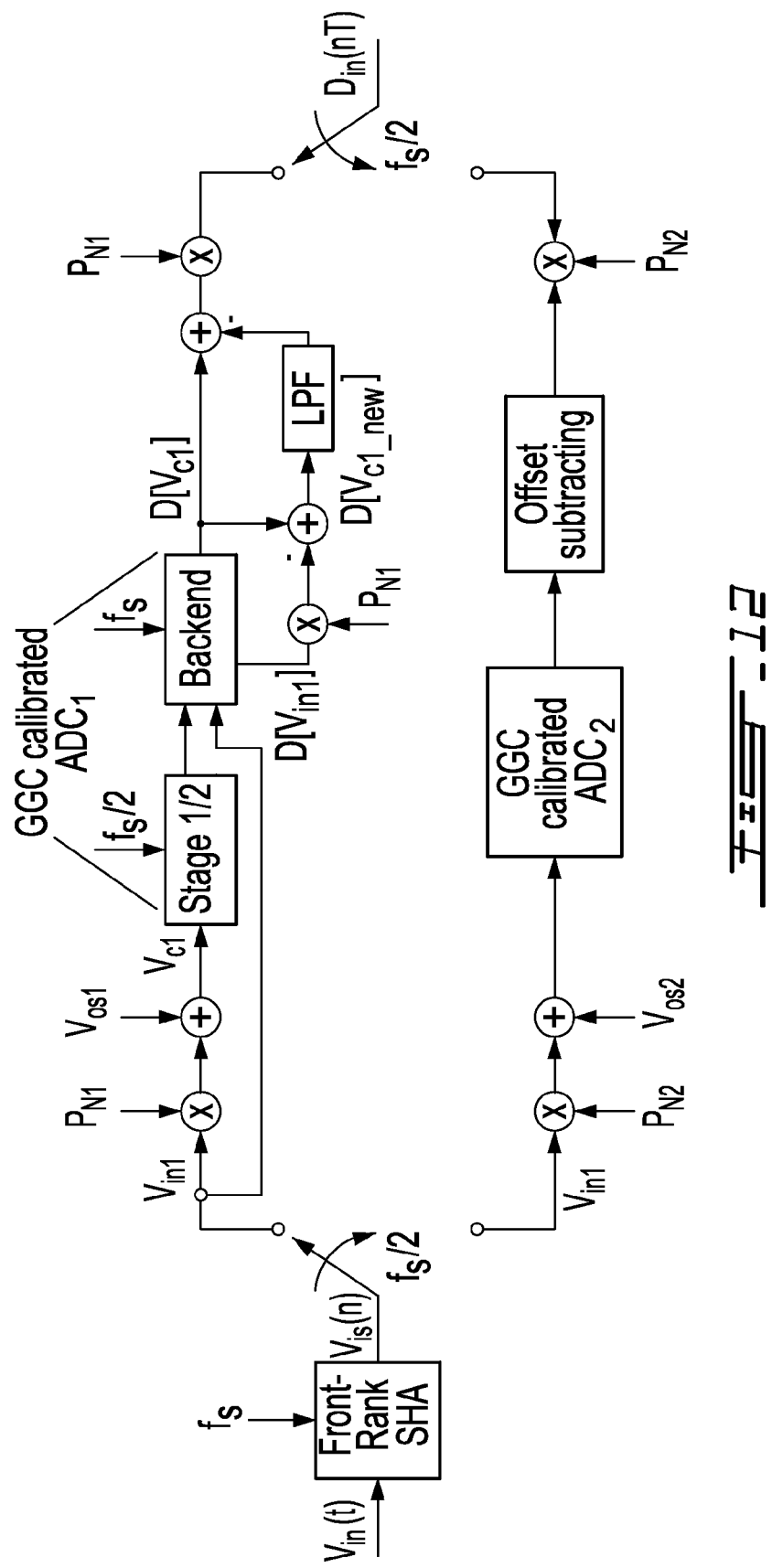
FIG. 12 is a block diagram of an embodiment of a background calibrated pipelined time-interleaved ADC.

As described above, global gain correction GGC equalizes the gain mismatch in the channels of TIADC's. For offset mismatch compensation, a chopper-based background calibration is known in the art, for example in S. M. Jamal, D. Fu, S. H. Lewis, and P. J. Hurst, "A 10-bit 120 M sample/s time-interleaved analog-to-digital converter with digital background calibration," *IEEE J. Solid-State Circuits*, vol. 37, pp. 1618–1627, December 2002. In this method, the input signal is converted to a white signal by a random chopper at the input. The output for each channel will contain little information at DC in addition to the offset and then a low-pass filter is used to extract the offset from every channel. The extraction of the offset is inaccurate especially when a full-scale input signal is spread so its power at DC is significant. To accelerate the extraction cycles the same backend used to shorten the calibration cycles for the ADC linearity could be used to predict the input signal before chopping as shown in FIG. 12. Thus instead of low-pass filtering the ADC output given by:

$$D[V_{c1}] = V_{in1} \cdot P_{N1} + V_{ox1} \tag{27}$$

the offset is extracted from the output given by:

$$D[V_{c1\_new}] = (V_{in1} - \hat{V}_{in1}) \cdot P_{N1} + V_{0S1} \cdot P_{N1} + V_{os1} \tag{28}$$

where $V_{ob1}$ is the offset of the backend ADC and $\hat{V}_{in1}$ is the input signal estimated by the ADC's backend. Though the backend offset will be spread and it may have some component at DC but this spreading will slightly influence the offset extracting compared to the case where the full-scale analog input $V_{in1}$ is spread and that will accelerate greatly the calibration cycles.

Results

Simulations have been performed to verify the effectiveness of these background calibration techniques on a 14-bit pipelined ADC. This ADC has two 2.5-bit front-end stages and a backend pan of nine 1.5-bit stages. A capacitor mismatch of ±0.2%, comparator offsets of ±$V_R$/10, and opamp DC gain of 60 dB were used in all the stages. The reference voltages for each flash sub-ADC and the calibration voltages circuit were generated by a simulated resistor ladder wherein each resistance was chosen with a random error of ±0.2% standard deviation. Only the 2 front-end 2.5-bit stages were calibrated. Without any special consideration to shorten the calibration cycles a number of samples around $2^{31}$ for the coefficients measurement (K=8) were needed. When the backend ADC and the SADC of the stage under calibration are used to shorten the calibration duration, the number of samples are shortened to $2^{21}$. A similar number of samples were needed when the input signal was supposed to have 0 power at fs/2 frequency and when the coefficient to be measured were shifted at this frequency.

A sinewave slightly lower that the full-scale signal around 1/20 the sampling frequency ($f_s$) was applied to the input of the 14-bit ADC before and after calibration. The signal-to-noise-and-distortion ratio (SNDR) is 64 dB resulting in an effective number of bits (ENOB) of 10.3 bits, and the spurious free dynamic range (SFDR) is 68.4 dB. The SNDR becomes 84 dB resulting an ENOB of 13.7 bits, and the SFDR is increased to 98 dB.

A 2-channel time-interleaved ADC was simulated before and after GGC. The 2 channels have the same configuration of the one used in the foregoing simulation and that were already calibrated by the proposed method and offset mismatch subtracted by shortening the calibration cycles as described above. Before GGC, the SNDR was 71 dB resulting an effective number of bits ENOB of 11.5 bits, and the SFDR was 74 dB. The SNDR became 82 dB resulting in an ENOB of 13.3 bits, and the SFDR was increased to 91 dB.

It will be appreciated that in the above described embodiments, there is provided a digital background calibration technique to compensate for the nonlinearity and the interstage gain error of the internal SDAC, amplifier finite DC gain and reference voltage inaccuracy in multi-bit/stage pipelined ADC. By injecting subtractive imprecise voltages (SIV) in a modified conventional multi-bit multiplying digital-to-analog converter (MDAC) and performing correlation based successive coefficient measurements (SCM), a background calibration is performed. Global gain correction of the ADC is also provided, and it is feasible to shorten the calibration duration. Simulation results demonstrate the effectiveness, of the above embodiments.

It will also be appreciated that the invention is not limited to calibration of components in an MDAC, but can be applied to other circuits in which the output of a first circuit or stage in which the components to be calibrated are found is measured by a second circuit or stage. It will also be appreciated that the invention can be used to calibrate a voltage reference to be used in a precise-voltage based application circuit.

Calibration of a Voltage Reference

In the embodiment of FIG. 8C, the invention is used to calibrate a voltage reference using the already calibrated pipelined ADC, so that a precision-voltage circuit 65 can make use of the calibration of the voltage reference.

Figure 9:
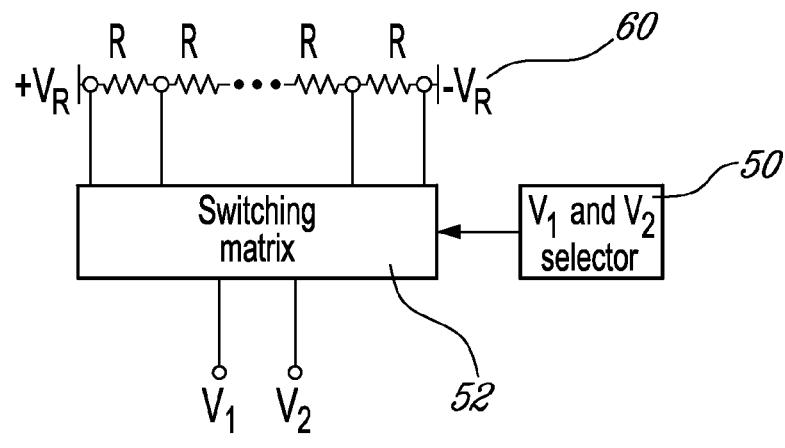
FIG. 9 is a block diagram of a switching matrix used to generate calibration voltages $V_1$ and $V_2$ from a string resistance dividing the voltage $(+V_R)-(-V_R)$.
Figure 13:
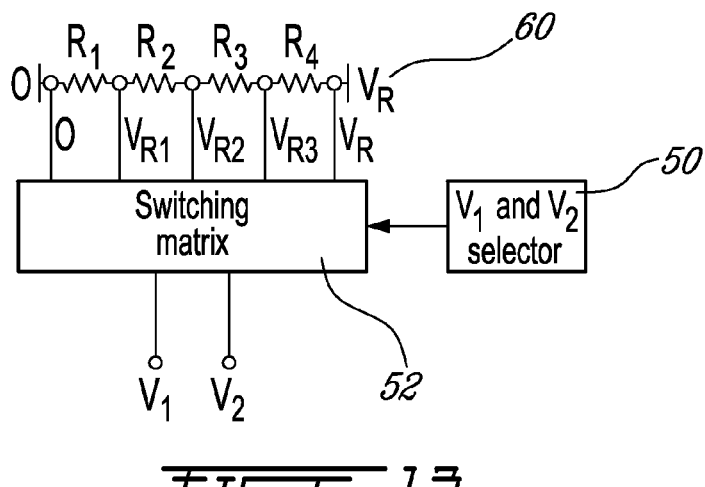
FIG. 13 shows a matrix used to generate the voltages $V_1$ and $V_2$ when K=4.

In this embodiment, the ratio of the resistances in a string-resistor 60 used to calibrate the ADCs or used by any other circuits integrated in the same chip is identified. To simplify the teaching of this embodiment, the string resistance 60 presented in FIG. 9 is redrawn in FIG. 13 with K=4 and equation 16 is rewritten as follows:

$$g_1 = G_A \cdot (V_{R3} - (C_4/C_f) \cdot V_R) \quad (29.1)$$

$$g_2 = G_A \cdot (V_{R3} - (C_4/C_f) \cdot V_{R2}) \quad (29.2)$$

$$g_3 = G_A \cdot (V_{R1} - (C_4/C_f) \cdot V_{R2}) \quad (29.3)$$

$$g_4 = G_A \cdot V_{R1} \quad (29.4)$$

The term $G_A(C_4/C_f)V_R$ is obtained independently from the resistance values using:

$$G_A(C_4/C_f)V_R = -g_1 + g_2 - g_3 + g_4 \quad (30)$$

Now by repeating the eqs (29) by choosing the voltages in the manner written in the following equations:

$$g_1 = G_A \cdot (V_R - (C_4/C_f) \cdot V_{R3}) \quad (31.1)$$

$$g_2 = G_A \cdot (V_{R2} - (C_4/C_f) \cdot V_{R3}) \quad (31.2)$$

$$g_3 = G_A \cdot (V_{R2} - (C_4/C_f) \cdot V_{R1}) \quad (31.3)$$

$$g_4 = -G_A \cdot (C_4/C_f) \cdot V_{R1} \quad (31.4)$$

The term $G_A \cdot V_R$ is obtained by:

$$G_A \cdot V_R = g_1 - g_2 + g_3 - g_4 \quad (32)$$

By replacing (32) in (29.1) we obtain $G_A \cdot V_{R3}$ which is the needed $V_{R3}$ multiplied by $G_A$.

Now by dividing $G_A \cdot V_{R3}$ by (32) we obtain $V_{R3}/V_R = a$ (33) independently from $G_A$.

By replacing (31.4) in (31.3) we obtain $G_A \cdot V_{R2} = g_3 - g_4$.

Now by dividing $G_A \cdot V_{R2}$ by (32) we obtain $V_{R2}/V_R = b$ (34) independently from $G_A$.

From (29.4) we have $G_A \cdot V_{R1}$. Again by dividing The latter value by (32) we obtain $V_{R1}/V_R = c$ (35).

It will now be shown how to find a digital ratio between $V_R$ and $V_{R1}$ ... $i \in \{1,2,3\}$, as performed by the Resistor/Voltage Ratio Estimator 62 shown in FIG. 8C.

The equations (33)–(35) can also be used directly to obtain the resistances values compared to $R_T = R_1 + R_2 + R_3 + R_4$ by using the following equations.

$$R_1/R_T = c \quad (36)$$

$$(R_1 + R_2)/R_T = b \text{ then } R_2/R_T = b - c \quad (37)$$

$$(R_1 + R_2 + R_3)/R_T = c \text{ then } R_3/R_T = a - b \quad (38)$$

To obtain $R_4/R_T$ we can switch the left side of $R_1$, in FIG. 1.a, to $V_R$ and the right side of $R_4$ to the ground and compute (29.4) again as:

$$g_{4-new} = G_A \cdot V_{R1-new} \quad (39)$$

By dividing (39) by (32) we obtain $V_{R1-new}/V_R = R_4/R_T = d$ (40).

Moreover, we can find all the resistance compared to $R_1$ as:

$$R_2/R_1 = (b-c)/c \quad (41)$$

$$R_3/R_1 = (a-b)/c \quad (42)$$

$$R_4/R_1 = d/c \quad (43).$$

The equations (33–35) can be used to trim the voltage values compared to $V_R$. In addition (36–38) or (41–43) can be used to trim the ratio between the resistances.

Figure 14:
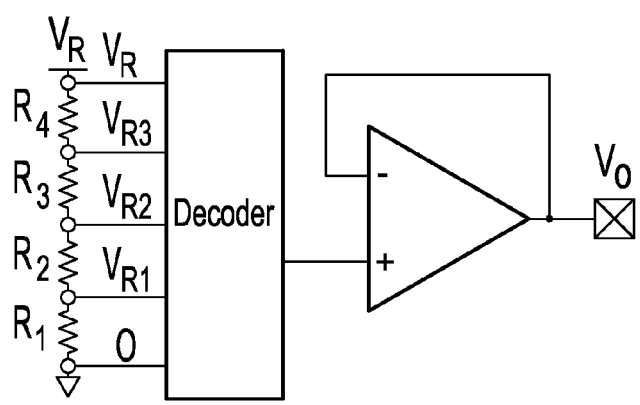
FIG. 14 is a circuit diagram of a resistor string DAC.
Figure 15:
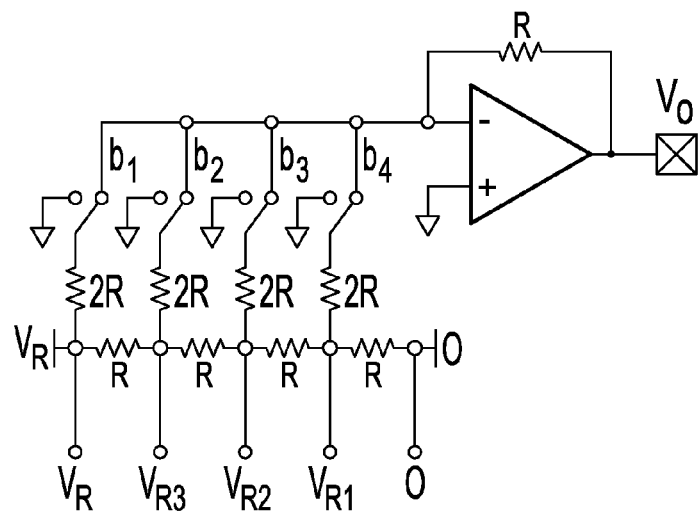
FIG. 15 is a circuit diagram of an R/2R DAC.

This string-resistance can be used in different applications such as resistor-string-DAC (FIG. 14) and R/2R-DAC (FIG. 15) or any other circuits that relies on high precision resistances and reference voltages. In the case of a resistor-string-DAC and R/2R-DAC the trimming of the resistance values is carried out without interrupting the operation of the DACs.

Since, the sting-resistances are available for the DAC's usage and the Calibrating ADC (calibrated using the method of the preferred embodiment), digital values corresponding to a,b,c, ... etc are used to modify the digital input $b_1$ the DAC (see FIG. 15) by corrective digital coefficients to compensate the non-linearity in the DAC-analog output due to the resistor mismatch.

Figure 16:
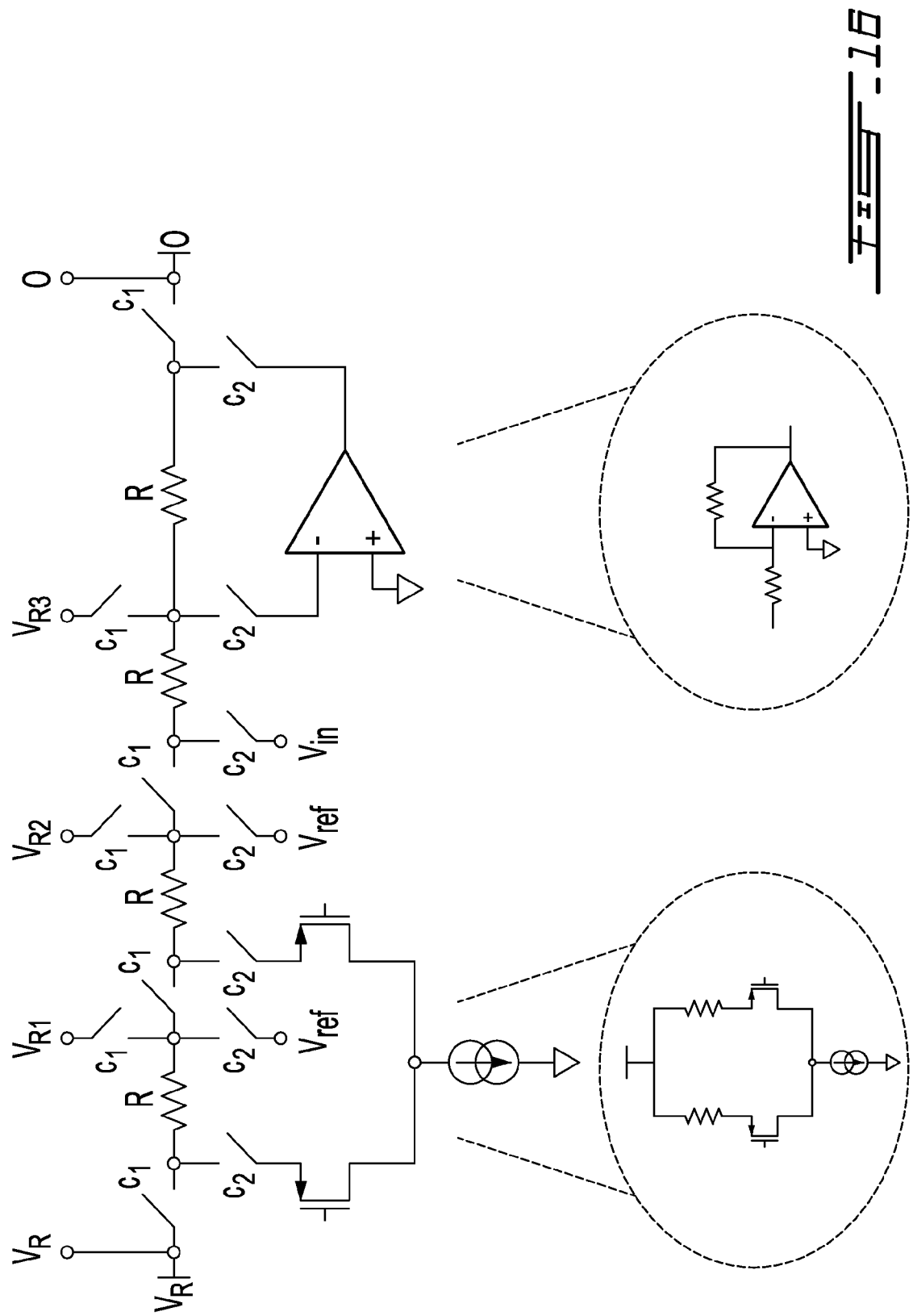
FIG. 16 is a circuit diagram of an op-amp/filter having control switches for configuration between calibration and normal operation phases.

In other applications, such as operational amplifier, gain stage or filter (see FIG. 16), the string resistances are not available to normal use and calibration. In this case, control switches $c_1$, $c_2$ are used to configure the circuits between the calibration phase and the normal operation phase. For instance when $c_1 = 1$ and $c_2 = 0$ the string resistance is configured in trimming mode. When $c_1 = 0$ and $c_2 = 1$ the circuit is configured in the normal operation mode.

Also, the reference voltages used in the injection could be generated not only from string resistance but also from reference voltages of different analog blocks 66 (see FIG. 8C) that their outputs will converted to digital values after signal processing. Digital coefficients could be found to take into consideration the mismatch between these voltages $V_{R1}, V_{R2}$ and $V_R$ in order to compensate the effect of the reference voltage mismatch.

Figure 17:
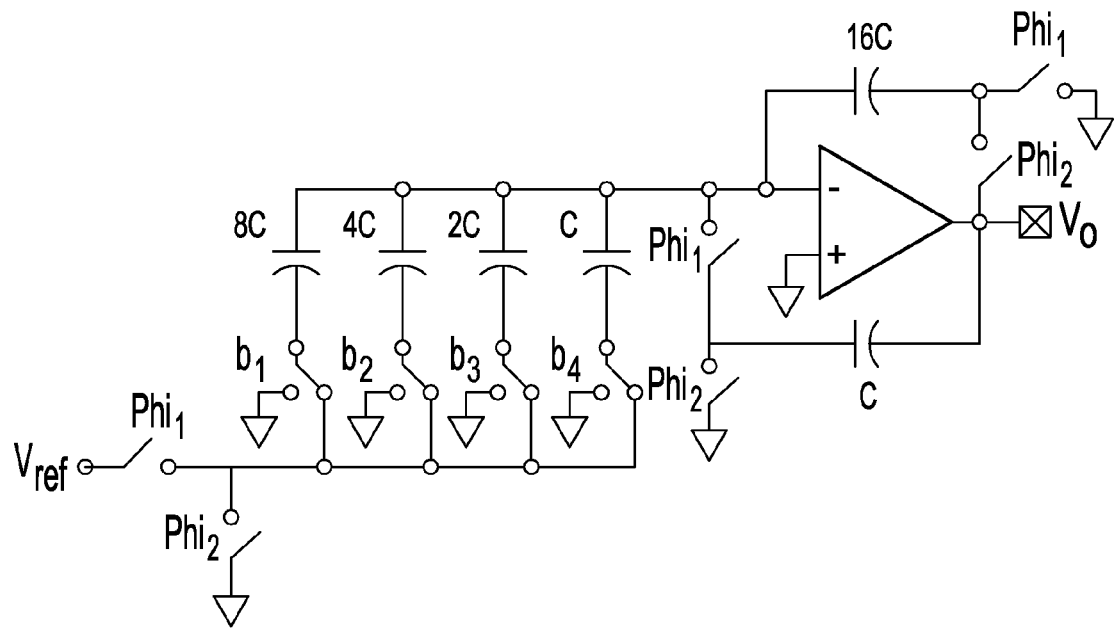
FIG. 17 is a circuit diagram of a charge capacitive DAC.

Also, passive trimming is not exclusive for resistor-based circuits. Capacitive based circuits could be calibrated also. For instance, the voltage used in this subtractive injection could be generated directly from a charge capacitive DAC, as shown in FIG. 17. In this case, the DAC output $V_p$ can be used instead of $V_1$ and $V_2$ in order to find corrective coefficient to compensate the DAC-nonlinearity due to the capacitor mismatch.

Figure 18:
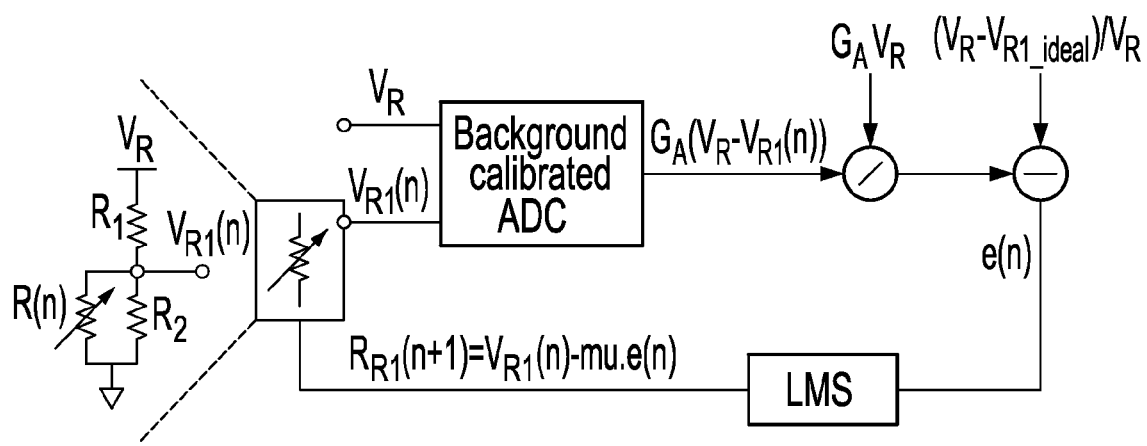
FIG. 18 is a circuit diagram of a trimmed analog circuit using a feedback voltage.

It will be appreciated that these equations can be used not only to determine the ratio of the resistances or voltages in the digital domain but also to trim the resistances or the capacitors values in a feedback manner using an adaptive algorithm (e.g. LMS). A matrix of passive element is used in parallel of the passive element used in the circuit to perform the trimming in the analog domain as shown in FIG. 18.

First the difference between voltage to be trimmed $V_{R1}$ ($R_2$) and $V_R$ is found using the Background Calibrated ADC as $G_A \cdot (V_{R-VR1}(n))$. The latter term is divided by $G_A \cdot V_R$ and subtracted from the desired value $(V_R-V_{R1\_ideal})/V_R$. An error signal e(n) is used to update the coefficients of an LMS filter. The negative feedback in the circuit will help the convergence of $G_A \cdot (V_R-V_{R1}(n))$ to the desire value $(V_R-V_{R1\_ideal})/V_R$.

Calibration of a Sample and Hold Circuit in a Flash ADC

Figure 19:
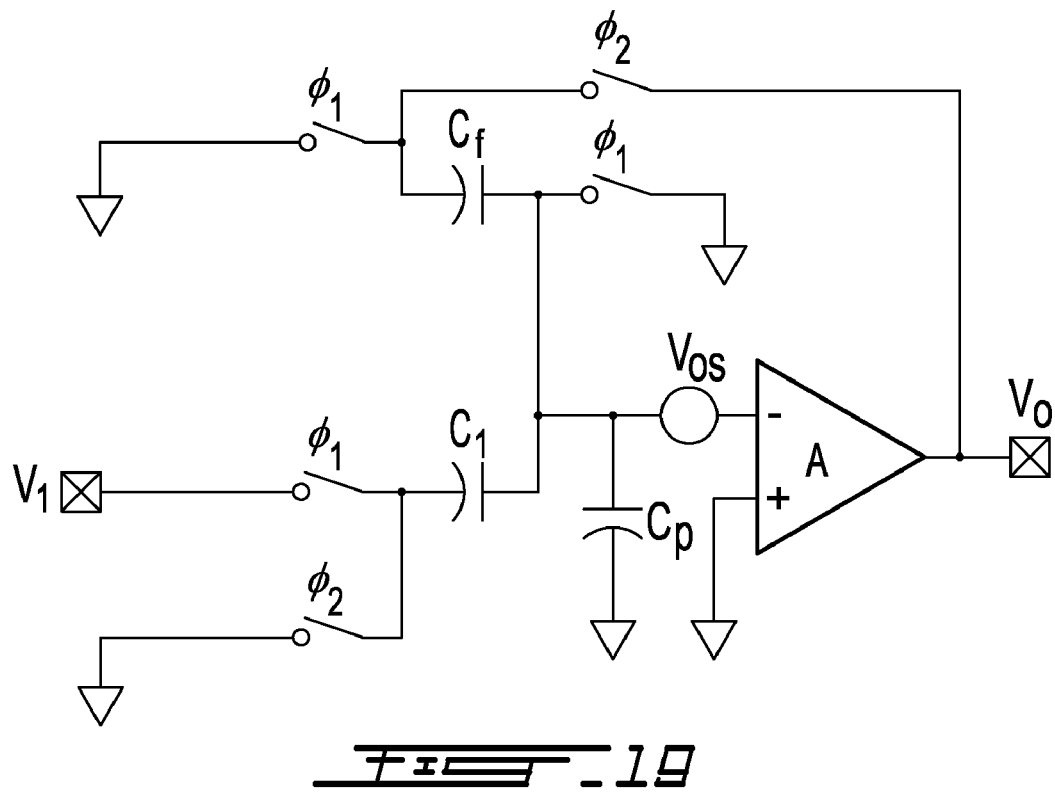
FIG. 19 is a circuit diagram of a prior art sample-and-hold circuit.

The invention can be applied to calibrate other circuits such as a sample-and-hold (S/H) circuit to correct gain error, for example. A prior art S/H is shown in FIG. 19 where the output voltage is given by:

$$V_a = \frac{1}{1+1/Af} \cdot \frac{C_1}{C_f} \cdot V_1 = G_A \cdot G_C \cdot V_1 \quad (44)$$

Gain error correction due to capacitor and finite op-amp gain is essential for S/H's, especially when they are used in time-interleaved applications.

Figure 20:
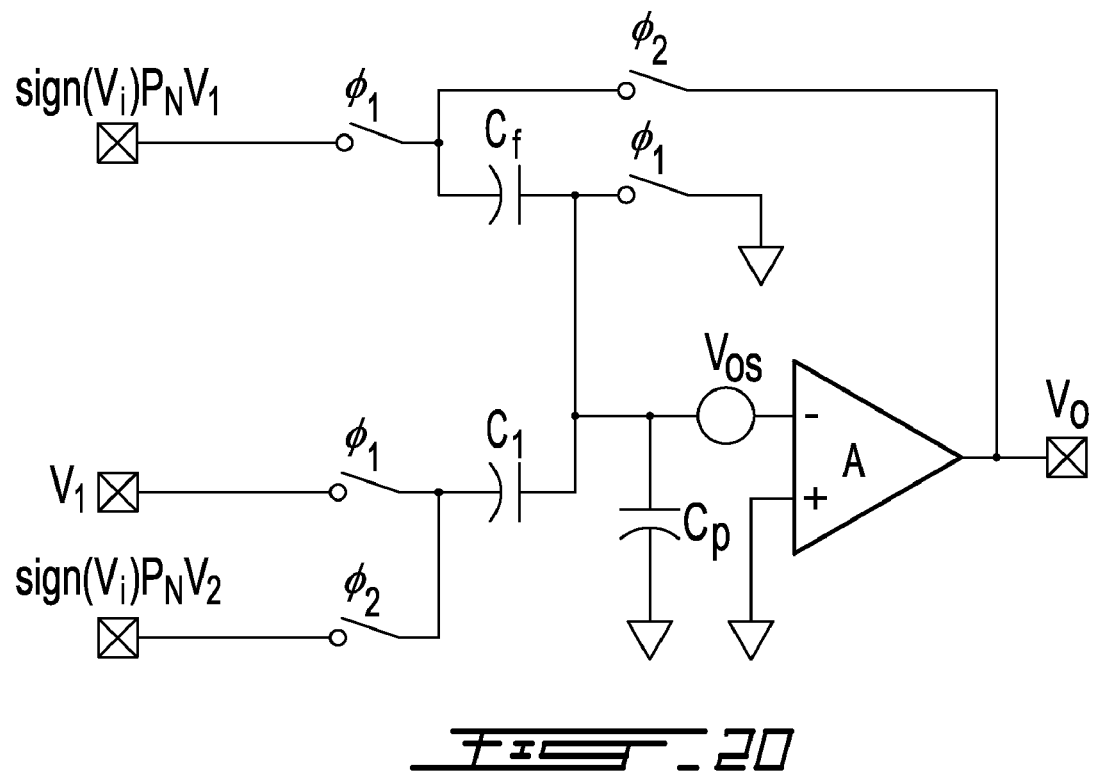
FIG. 20 is a circuit diagram of a modified sample-and-hold circuit according to an embodiment of the invention.

For calibration purposes, the front-end S/H circuit according to this embodiment of the invention is changed as shown in FIG. 20. In this case, there is no need to add a capacitor to perform voltage subtraction. Instead, the sign of the input signal $V_1$ is monitored using a comparator and a voltage equal to $V_R$ is injected without affecting the dynamic range of the S/H as shown in FIG. 21a. Here, $V_1$ is chosen to be equal to ground and $V_2=\text{sign}(V_1) \cdot V_R$ where $\text{sign}(V_1)=-1$ when $V_1$ is positive and $\text{sign}(V_1)=1$ when $V_1$ is negative. In this case, the S/H output will be given by:

$$V_o = G_A \cdot G_C \cdot (V_1 - PN \cdot \text{sign}(V_1) \cdot V_R) \quad (45)$$

Using one comparator to compare $V_1$ with the ground and to find $\text{sign}(V_1)$ may lead to distortion in the S/H transfer function when the comparator is not accurate as shown in point A in FIG. 21b where $V_o$ exceeds the reference voltage $V_R$. Therefore, instead of using an accurate comparator, two imprecise comparators are used. One comparator compares $V_1$ with $$-\frac{V_R}{4}$$

and the other compares $V_1$ with $$\frac{V_R}{4}.$$

Thus, the voltage $V_2$ is chosen equal to $\text{sign}(V_1) \cdot V_R$ when $$V_1 \geq \frac{V_R}{4} \text{ or } V_1 \leq -\frac{V_R}{4}.$$

Otherwise, $V_2$ is chosen equal 0 by forcing PN to be 0 (see FIG. 21c). In this case, an offset in every comparator as large as $$\frac{V_R}{4}$$

is tolerated without overloading the S/H output.

The output of the S/H $V_o$ is correlated with $PN \cdot \text{sign}(V_1)$ in the background to extract the gain $G_A \cdot G_C$ of the S/H. A multiplication by $1/G_A \cdot G_C$ for the final output of the ADC will compensate the gain error resulting from the S/H circuit.

What is claimed is:

1. A method of background calibrating a circuit to be calibrated having a plurality of circuit elements and providing an output residue having a dynamic range for measurement, the method comprising:

switching one of said circuit elements to be substituted by an equivalent circuit element within said circuit;

injecting at least one calibration signal into at least one of said circuit elements, wherein said calibration signal causes a measurable change in said output residue;

measuring said change;

calculating a calibration parameter for said circuit based on said change; and performing a calibration correction to an output of said circuit using said parameter, wherein said injecting comprises:

providing at least two calibration signals to operate in said circuit in a subtractive manner so that said output residue remains within said dynamic range;

providing a group of different imprecise voltages for said calibration signals having at least one value that used alone would cause said residue to lie outside said dynamic range and at least one value that used alone would cause said residue to lie within said dynamic range;

selecting a series of different combinations of ones of said group of imprecise voltages for injection in said subtractive manner, said series of combinations including one of said imprecise voltages to be isolated once, a remainder of said imprecise voltages each used in two of said different combinations, with one of said different combinations comprising a zero voltage and one of said imprecise voltages having a value that used alone would cause said residue to lie within said dynamic range; and injecting in said circuit each of said different combinations of said imprecise voltages as said calibration signals;

said measuring comprising measuring said change for each of said different combinations, and said calculating said calibration parameter comprises calculating, from a sum of said change measured for each of said different combinations, a value as a function of said one of said imprecise voltages to be isolated independently of said remainder of said imprecise voltages.

2. The method as claimed in claim 1, wherein said performing a calibration correction comprises correcting for said measurable change.

3. The method as claimed in claim 2, wherein said calibration correction is a global correction consistent with other circuits operative with said circuit to be calibrated.

4. The method as claimed in claim 1, wherein said providing a group of imprecise voltages comprises:
providing a string resistance connected at one end to a reference voltage and to said zero voltage at another end.

5. The method as claimed in claim 4, wherein said output residue is essentially an AC signal, and said change is measured by obtaining an average of said output residue with said calibration signal injected and an average of said output residue without said calibration signal injected, said change being a difference between said averages.

6. The method as claimed in claim 5, wherein said injecting comprises alternating between no injecting and injecting of said calibration signal from measurement to measurement.

7. The method as claimed in claim 6, wherein said injecting alternates in a random or pseudorandom manner, whereby said averages are free of aliasing.

8. The method as claimed in claim 5, wherein said circuit is a pipelined ADC comprising a plurality of stages, said measuring being performed using said stages downstream of one of said stages whose circuit elements are being calibrated, said magnitude of said measurable change being small enough such that said output residue is within a dynamic range of said downstream stages.

9. The method as claimed in claim 8, wherein said reference voltage is used in at least one sub-DAC of said pipelined ADC.

10. The method as claimed in claim 8, wherein said residue occupies an identified frequency range during normal operation, said injecting comprises alternating between no injecting and injecting of said calibration signal from measurement to measurement at a frequency resulting in said measurable change having a frequency outside of said frequency range, and said measuring comprises filtering said residue to detect said change at said frequency outside of said frequency range.

11. The method as claimed in claim 10, further comprising detecting said identified frequency range, determining whether there is a suitable said frequency resulting in said measurable change having a frequency outside of said frequency range, and if not said change is measured by obtaining an average of said output residue with said calibration signal injected and an average of said output residue without said calibration signal injected, said change being a difference between said averages, said injecting alternating in a random or pseudorandom manner, whereby said averages are free of aliasing.

12. The method as claimed in claim 8, wherein said pipelined ADC comprises at least three stages and a backend stage of said pipelined ADC operates at a multiple of a frequency of said ADC, said backend stage being used to measure said change in said output residue of a plurality of stages.

13. The method as claimed in claim 8, wherein said calibration correction is a global gain correction consistent with other circuits operative with said circuit to be calibrated, said calibration parameter comprising a transfer characteristic gain of said ADC to be calibrated, said global gain correction comprising dividing a final digital output of said ADC to be calibrated by transfer characteristic gain.

14. The method as claimed in claim 13, wherein said pipelined ADC circuit to be calibrated is one of a group of time-interleaved ADC circuits, said calibration correction reducing gain mismatch across channels of said group.

15. A method of background calibrating a circuit to be calibrated having a plurality of circuit elements and providing an output residue, the method comprising:
switching one of said circuit elements to be substituted by an equivalent circuit element within said circuit;
injecting at least one calibration signal into at least one of said circuit elements, wherein said calibration signal causes a measurable change in said output residue;
measuring said change;
calculating a calibration parameter for said circuit based on said change; and
performing a calibration correction to an output of said circuit using said parameter and correcting for said measurable change in said output residue, wherein said residue occupies an identified frequency range during normal operation, said injecting comprises alternating between no injecting and injecting of said calibration signal from measurement to measurement at a frequency resulting in said measurable change having a frequency outside of said frequency range, and said measuring comprises filtering said residue to detect said change at said frequency outside of said frequency range.

16. The method as claimed in claim 15, further comprising detecting said identified frequency range, determining whether there is a suitable said frequency resulting in said measurable change having a frequency outside of said frequency range, and if not said change is measured by obtaining an average of said output residue with said calibration signal injected and an average of said output residue without said calibration signal injected, said change being a difference between said averages, said injecting alternating in a random or pseudorandom manner, whereby said averages are free of aliasing.

17. A method of calibrating a voltage reference, the method comprising:
a) providing a first circuit having a plurality of calibrated circuit elements and generating an output residue having a dynamic range for measurement, said calibrated circuit elements having a known value;
b) providing at least two calibration signals to operate in said first circuit in a subtractive manner so that said output residue remains within said dynamic range;
c) providing a group of different imprecise voltages for said calibration signals having at least one value that used alone would cause said residue to lie outside said dynamic range and at least one value that used alone would cause said residue to lie within said dynamic range;
d) selecting a series of different combinations of ones of said group of imprecise voltages for injection in said subtractive manner, said series of combinations including one of said imprecise voltages to be isolated once, a remainder of said imprecise voltages each used in two of said different combinations, with one of said different combinations comprising a zero voltage and one of said imprecise voltages having a value that used alone would cause said residue to lie within said dynamic range;
e) injecting in said first circuit each of said different combinations of said imprecise voltages as said calibration signals;

f) measuring said change for each of said different combinations; and g) calculating, from a sum of said change measured for each of said different combinations, a value that is a function of said one of said imprecise voltages to be isolated independently of said remainder of said imprecise voltages.

18. The method as claimed in claim 17, wherein said providing a group of imprecise voltages comprises:

providing a string resistance connected at one end to a reference voltage and to said zero voltage at another end.

19. The method as claimed in claim 18, wherein steps (c) through (g) are repeated to identify a ratio of resistances in said string resistance.

20. The method as claimed in claim 18, further comprising:

switching one of said circuit elements in said first circuit receiving one of said calibration signals to be substituted by an equivalent circuit element within said circuit; and correcting for said measurable change in an output of said first circuit;

wherein said calibrating is performed in the background during normal operation of said first circuit.

21. The method as claimed in claim 20, wherein said output residue is essentially an AC signal, and said change is measured by obtaining an average of said output residue with said calibration signal injected and an average of said output residue without said calibration signal injected, said change being a difference between said averages.

22. The method as claimed in claim 21, wherein said injecting comprises alternating between no injecting and injecting of said calibration signal from measurement to measurement.

23. The method as claimed in claim 22, wherein said injecting alternates in a random or pseudorandom manner, whereby said averages are free of aliasing.

24. The method as claimed in claim 20, wherein said first circuit is a pipelined ADC comprising a plurality of stages, said measuring being performed using said stages downstream of one of said stages whose circuit elements are subject to said injecting, said magnitude of said measurable change being small enough such that said output residue is within a dynamic range of said downstream stages.

25. The method as claimed in claim 24, wherein said residue occupies an identified frequency range during normal operation, said injecting comprises alternating between no injecting and injecting of said calibration signal from measurement to measurement at a frequency resulting in said measurable change having a frequency outside of said frequency range, and said measuring comprises filtering said residue to detect said change at said frequency outside of said frequency range.

26. The method as claimed in claim 25, further comprising detecting said identified frequency range, determining whether there is a suitable said frequency resulting in said measurable change having a frequency outside of said frequency range, and if not said change is measured by obtaining an average of said output residue with said calibration signal injected and an average of said output residue without said calibration signal injected, said change being a difference between said averages, said injecting alternating in a random or pseudorandom manner, whereby said averages are free of aliasing.

27. The method as claimed in claim 24, wherein said pipelined ADC comprises at least three stages and a backend stage of said pipelined ADC operates at a multiple of a frequency of said ADC, said backend stage being used to measure said change in said output residue of a plurality of stages.

28. The method as claimed in claim 17, wherein said first circuit comprises circuitry that outputs as said residue a difference between said calibration signals, said reference value being said value calculated in step (g) that is equal to said one of said imprecise voltages to be isolated.

29. The method as claimed in claim 17, wherein said group of imprecise voltages comprises more than five imprecise voltages.

30. The method as claimed in claim 17, wherein said residue occupies an identified frequency range during normal operation, said injecting comprises alternating between no injecting and injecting of said calibration signal from measurement to measurement at a frequency resulting in said measurable change having a frequency outside of said frequency range, and said measuring comprises filtering said residue to detect said change at said frequency outside of said frequency range.

31. The method as claimed in claim 30, further comprising detecting said identified frequency range, determining whether there is a suitable said frequency resulting in said measurable change having a frequency outside of said frequency range, and if not said change is measured by obtaining an average of said output residue with said calibration signal injected and an average of said output residue without said calibration signal injected, said change being a difference between said averages, said injecting alternating in a random or pseudorandom manner, whereby said averages are free of aliasing.

32. A method of background calibrating a pipelined ADC circuit to be calibrated having a plurality of circuit elements and providing an output residue, the method comprising:

injecting at least one calibration signal into at least one of said circuit elements of a stage of said ADC under calibration, wherein said calibration signal causes a measurable change in said output residue of said stage;

predicting a value of said output residue of said stage without said injecting;

using a backend ADC of said pipelined ADC to measure an output residue of a stage upstream of said stage under calibration, and predicting a value of a sub-DAC output of said stage under calibration;

measuring said change using said output residue of said stage under calibration using said backend ADC, said predicted value of said output residue of said stage without said injecting, and said predicted value of said sub-DAC output of said stage under calibration;

calculating a calibration parameter for said circuit based on said change; and performing a calibration correction to an output of said circuit using said parameter.

33. The method as claimed in claim 32, wherein said measuring comprises obtaining an average of said comparison of said output residue with said predicted value.

34. A method of background calibrating a circuit to be calibrated having a plurality of circuit elements and providing an output residue, said residue occupying an identified frequency range during normal operation, the method comprising:

injecting at least one calibration signal into at least one of said circuit elements of said circuit, wherein said calibration signal causes a measurable change in said output residue of said stage, and alternating between no injecting and injecting of said calibration signal from measurement to measurement at an injection frequency resulting in said measurable change having a frequency outside of said frequency range;

detecting said identified frequency range, and setting said injection frequency such that said measurable change has a frequency outside said identified frequency range;

filtering said residue to detect said change at said frequency outside of said frequency range;

calculating a calibration parameter for said circuit based on said change; and performing a calibration correction to an output of said circuit using said parameter.

35. The method as claimed in claim 34, wherein when there is no suitable said injection frequency resulting in said measurable change having a frequency outside of said frequency range, then said change is measured by obtaining an average of said output residue with said calibration signal injected and an average of said output residue without said calibration signal injected, said change being a difference between said averages, said injecting alternating in a random or pseudorandom manner, whereby said averages are free of aliasing.

36. The method as claimed in claim 35, wherein said circuit is a pipelined ADC circuit, and said filtering comprises using a backend ADC of said pipelined ADC to measure said filtered residue.

* * * * *